(12) United States Patent
Chen et al.

(10) Patent No.: US 12,046,579 B2
(45) Date of Patent: Jul. 23, 2024

(54) PACKAGE HAVING BONDING LAYERS

(71) Applicant: Taiwan Semiconductor Manufacturing Company, Ltd., Hsinchu (TW)

(72) Inventors: Ming-Fa Chen, Taichung (TW); Chao-Wen Shih, Hsinchu County (TW); Hsien-Wei Chen, Hsinchu (TW); Sung-Feng Yeh, Taipei (TW); Tzuan-Horng Liu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 510 days.

(21) Appl. No.: 17/344,928

(22) Filed: Jun. 10, 2021

(65) Prior Publication Data

US 2021/0305214 A1    Sep. 30, 2021

Related U.S. Application Data

(62) Division of application No. 16/572,622, filed on Sep. 17, 2019, now Pat. No. 11,063,022.

(51) Int. Cl.
*H01L 25/065*    (2023.01)
*H01L 21/304*    (2006.01)
(Continued)

(52) U.S. Cl.
CPC ........ *H01L 25/0657* (2013.01); *H01L 21/304* (2013.01); *H01L 21/56* (2013.01);
(Continued)

(58) Field of Classification Search
CPC ... H01L 25/0657; H01L 21/304; H01L 21/56; H01L 23/3157; H01L 23/5384; H01L 23/544; H01L 24/05; H01L 21/6835; H01L 27/1266; H01L 2224/0231; H01L 2224/02372; H01L 2224/80203; H01L 2224/8084; H01L 2225/06541; H01L 24/08; H01L 2224/05624; H01L 2224/05647; H01L 2224/05655; H01L 2224/05666; H01L 2224/05684; H01L 2224/08057; H01L 2224/08145; H01L 2224/19; H01L 2224/215; H01L 2224/29186; H01L 2224/73251; H01L 2224/80006; H01L 2224/8001; H01L 2224/80013; H01L 2224/80048; H01L 2224/80097; H01L 2224/8013; H01L 2224/80379; H01L 2224/80906;
(Continued)

(56) References Cited

U.S. PATENT DOCUMENTS 8,993,380 B2    3/2015 Hou et al.
9,281,254 B2    3/2016 Yu et al.
(Continued)

*Primary Examiner* — Jonathan Han
(74) *Attorney, Agent, or Firm* — JCIPRNET

(57) ABSTRACT

A package includes a carrier substrate, a first die, and a second die. The first die includes a first bonding layer, a second bonding layer opposite to the first bonding layer, and an alignment mark embedded in the first bonding layer. The first bonding layer is fusion bonded to the carrier substrate. The second die includes a third bonding layer. The third bonding layer is hybrid bonded to the second bonding layer of the first die.

20 Claims, 25 Drawing Sheets

(51) Int. Cl.
*H01L 21/56* (2006.01)
*H01L 21/683* (2006.01)
*H01L 23/00* (2006.01)
*H01L 23/31* (2006.01)
*H01L 23/538* (2006.01)
*H01L 23/544* (2006.01)
*H01L 27/12* (2006.01)

(52) U.S. Cl.
CPC ...... *H01L 23/3157* (2013.01); *H01L 23/5384* (2013.01); *H01L 23/544* (2013.01); *H01L 24/05* (2013.01); *H01L 21/6835* (2013.01); *H01L 27/1266* (2013.01); *H01L 2224/0231* (2013.01); *H01L 2224/02372* (2013.01); *H01L 2224/80203* (2013.01); *H01L 2224/8084* (2013.01); *H01L 2225/06541* (2013.01)

(58) Field of Classification Search
CPC . H01L 2224/80948; H01L 2224/83405; H01L 2224/83409; H01L 2224/83417; H01L 2224/83486; H01L 2224/83493; H01L 2224/9222; H01L 2224/95; H01L 24/80; H01L 24/92; H01L 24/95; H01L 24/96; H01L 2224/80007; H01L 2224/80132; H01L 2224/83896; H01L 2224/92242; H01L 2221/68345; H01L 2221/68359; H01L 2224/18; H01L 2224/20; H01L 2224/96; H01L 2225/06524; H01L 2225/06548; H01L 25/50; H01L 2223/54426

See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2019/0139935 A1* | 5/2019 | Chen .................. H01L 21/565 |

* cited by examiner

PACKAGE HAVING BONDING LAYERS

CROSS-REFERENCE TO RELATED APPLICATION

This application is a divisional application of and claims the priority benefit of a prior application Ser. No. 16/572,622, filed on Sep. 17, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
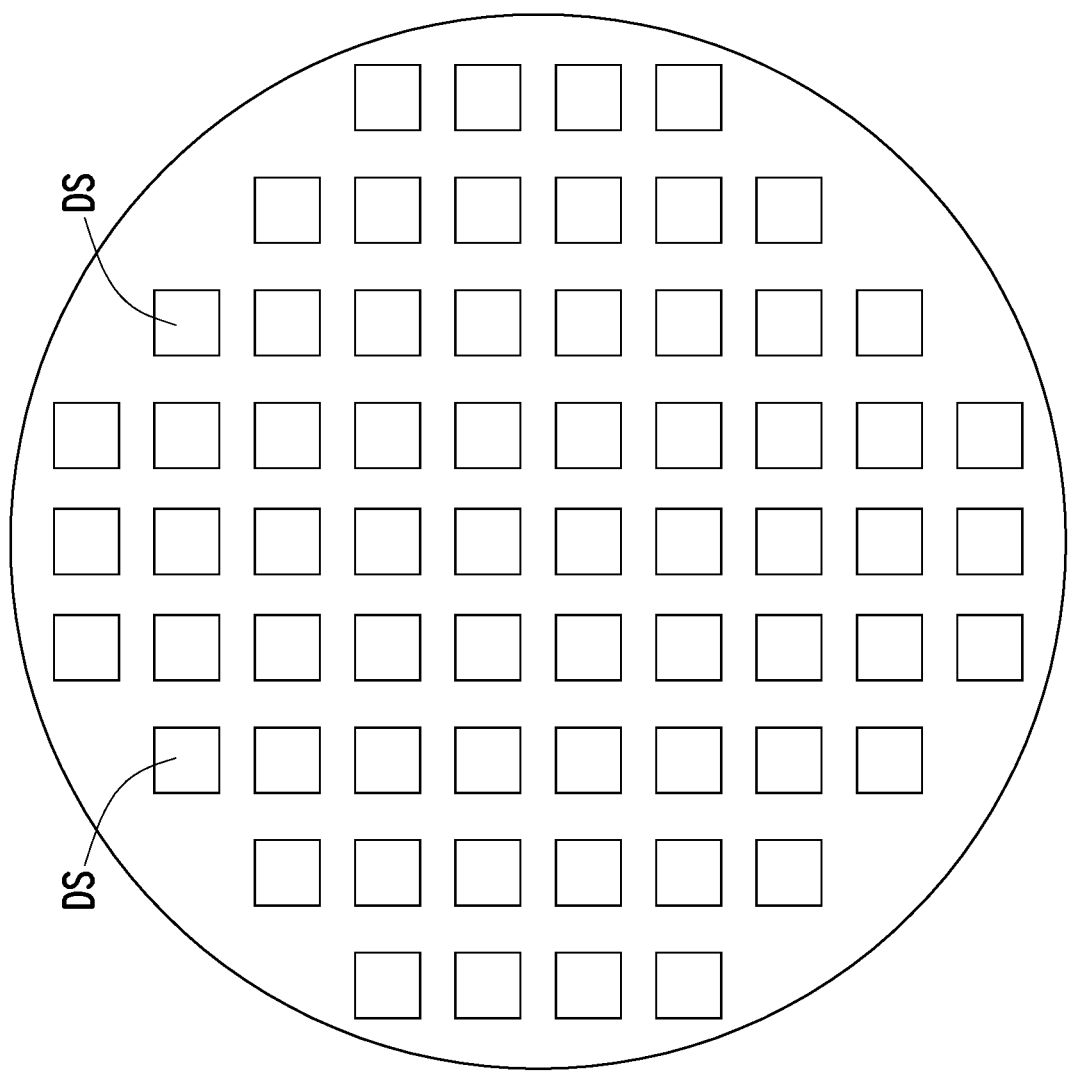
FIG. 1 is a schematic view of a reconstructed wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic view of a reconstructed wafer RW. Referring to FIG. 1, the reconstructed wafer RW includes a plurality of die stacks DS arranged in an array. In some embodiments, the die stacks DS are assemblies of known good dies (KND). For example, dies formed from a wafer are inspected and tested. Subsequently, the dies that are being determined as good dies are picked-and-placed onto another wafer to form the reconstructed wafer RW. As such, the reconstructed wafer RW has a high yield (i.e. 100% good die). In some embodiments, the reconstructed wafer RW may undergo further processing, such as a dicing step, to form a plurality of packages. The manufacturing process of the reconstructed wafer RW will be described in detail below in conjunction with FIG. 2A to FIG. 2K.

Figure 2A:
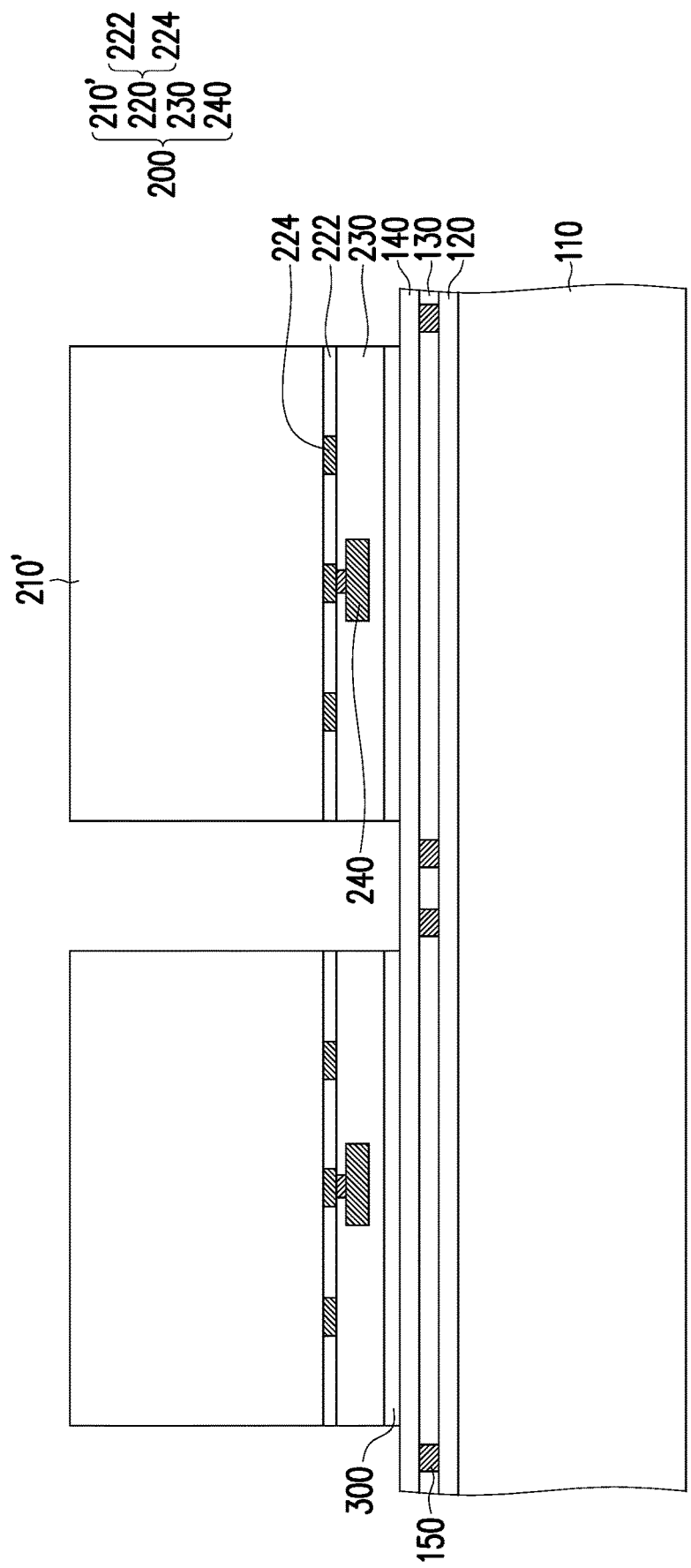
FIG. 2A to FIG. 2K are schematic cross-sectional views illustrating a manufacturing process of a reconstructed wafer in accordance with some embodiments of the disclosure.

FIG. 2A to FIG. 2K are schematic cross-sectional views illustrating a manufacturing process of a reconstructed wafer RW in accordance with some embodiments of the disclosure. Referring to FIG. 2A, a carrier substrate 110 is provided. In some embodiments, the carrier substrate 110 includes semiconductor materials. For example, the carrier substrate 110 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the carrier substrate 110 is free of active components and passive components. In some embodiments, the carrier substrate 110 is also free of wire routings. For example, the carrier substrate 110 may be a blank substrate which purely functions as a supporting element without serving any signal transmission function.

As illustrated in FIG. 2A, a dielectric layer 120, a dielectric layer 130, and a bonding layer 140 are sequentially disposed on the carrier substrate 110. In other words, the dielectric layer 130 is sandwiched between the dielectric layer 120 and the bonding layer 140. In some embodiments, the dielectric layer 120 and the dielectric layer 130 may be formed by suitable fabrication techniques, such as vapor deposition, spin coating, atomic layer deposition (ALD), thermal oxidation, some other suitable deposition or growth process, or a combination thereof. The vapor deposition may include, for example, chemical vapor deposition (CVD), physical vapor deposition (PVD), some other suitable vapor deposition process, or a combination thereof. In some embodiments, materials of the dielectric layer 120 and the dielectric layer 130 may be the same. For example, the dielectric layer 120 and the dielectric layer 130 may be polyimide, polybenzoxazole (PBO), benzocyclobutene (BCB), a nitride such as silicon nitride, an oxide such as silicon oxide, undoped silicate glass (USG), phosphosilicate glass (PSG), borosilicate glass (BSG), boron-doped phosphosilicate glass (BPSG), a combination thereof, or the like. However, the disclosure is not limited thereto. In some alternative embodiments, the material of the dielectric layer 120 may be different from the material of the dielectric layer 130. For example, the material of the dielectric layer 120 may include undoped silicate glass (USG) while the material of the dielectric layer 130 may include a nitride such as silicon nitride. In some embodiments, the dielectric layer 120 and the dielectric layer 130 are able to control the warpage during subsequent processes. For example, the dielectric layer 120 and the dielectric layer 130 are able to reduce the overall warpage of the later-formed reconstructed wafer or package.

As illustrated in FIG. 2A, a plurality of alignment marks 150 are embedded in the dielectric layer 130. In other words, the alignment marks 150 are formed on the carrier substrate 110. In some embodiments, the alignment marks 150 may be a patterned copper layer or other suitable patterned metal layer. In some embodiments, the alignment marks 150 may be formed by electroplating or deposition. It should be noted that the shapes and numbers of the alignment marks 150 are not limited in the disclosure, and may be designated based on the demand and/or design layout. In some embodiments, a top surface of the dielectric layer 130 is substantially levelled with top surfaces of the alignment marks 150. In some embodiments, the alignment marks 150 are electrically isolated from other components. In other words, the alignment marks 150 are electrically floating.

In some embodiments, the bonding layer 140 is a smooth layer having a continuous even surface and overlaid on the dielectric layer 130 and the alignment marks 150. In some embodiments, a material of the bonding layer 140 may include silicon oxynitride (SiON), silicon oxide, silicon nitride or the like, and the bonding layer 140 may be formed by deposition or the like. In some embodiments, the bonding layer 140 has a substantially uniform and even thickness.

As illustrated in FIG. 2A, a plurality of dies 200 is attached to the carrier substrate 110. In some embodiments, each die 200 includes a semiconductor substrate 210', an interconnection structure 220, a passivation layer 230, and a conductive pad 240. In some embodiments, the interconnection structure 220 is disposed on the semiconductor substrate 210'. The semiconductor substrate 210' may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 210' may include active components (e.g., transistors or the like) and/or passive components (e.g., resistors, capacitors, inductors, or the like) formed therein.

In some embodiments, the interconnection structure 220 includes an inter-dielectric layer 222 and a plurality of conductive patterns 224 embedded in the inter-dielectric layer 222. In some embodiments, the conductive patterns 224 of the interconnection structure 220 are electrically connected to the active components and/or the passive components embedded in the semiconductor substrate 210'. In some embodiments, a material of the inter-dielectric layers 222 includes polyimide, epoxy resin, acrylic resin, phenol resin, benzocyclobutene (BCB), polybenzoxazole (PBO), combinations thereof, or other suitable dielectric materials. The inter-dielectric layers 222 may be formed by suitable fabrication techniques, such as spin-on coating, lamination, chemical vapor deposition (CVD), or the like. In some embodiments, a material of the conductive patterns 224 includes aluminum, titanium, copper, nickel, tungsten, and/or alloys thereof. The conductive patterns 224 may be formed by, for example, electroplating, deposition, and/or photolithography and etching. For simplicity, the interconnection structure 220 is illustrated as having one layer of inter-dielectric layer 222 and one layer of conductive patterns 224 in FIG. 2A. However, the disclosure is not limited thereto. In some alternative embodiments, the number of the layer of the inter-dielectric layer 222 and the number of the layer of the conductive patterns 224 may be adjusted depending on the routing requirements. For example, multiple layers of the inter-dielectric layer 122 and multiple layers of the conductive patterns 224 may be presented in the interconnection structure 220, and the conductive patterns 224 and the inter-dielectric layers 222 may be stacked alternately.

In some embodiments, the conductive pad 240 is disposed over the interconnection structure 220. In some embodiments, the conductive pad 240 is electrically connected to the conductive patterns 224 of the interconnection structure 200. In some embodiments, the conductive pad 240 is used to establish electrical connection with other components (not shown) or dies (not shown) subsequently formed or provided. In some alternative embodiments, the conductive pad 240 may be test pads used to probe the die 200 in which the conductive pad 240 is included. In some embodiments, the conductive pad 240 may be aluminum pads, copper pads, or other suitable metal pads. It should be noted that the number and shape of the conductive pad 240 may be selected based on demand.

In some embodiments, the passivation layer 230 is formed over the interconnection structure 220 to seal the conductive pad 240. In some embodiments, a material of the passivation layer 230 includes oxides, such as silicon oxide or the like. Alternatively, the passivation layer 230 may include polyimide, epoxy resin, acrylic resin, phenol resin, benzocyclobutene (BCB), polybenzoxazole (PBO), or any other suitable polymer-based dielectric material. The passivation layer 230, for example, may be formed by suitable fabrication techniques, such as spin-on coating, CVD, PECVD, or the like.

In some embodiments, the dies 200 may be capable of performing logic functions. For example, the dies 200 may be Central Process Unit (CPU) dies, Graphic Process Unit (GPU) dies, Field-Programmable Gate Array (FPGA), or the like.

In some embodiments, prior to the placement of the dies 200, a bonding layer 300 is formed on each of the dies 200. For example, the bonding layer 300 is formed on the passivation layer 230 of the die 200. In some embodiments, the bonding layer 300 is a smooth layer having a continuous even surface. In some embodiments, a material of the bonding layer 300 may include silicon oxynitride (SiON), silicon oxide, silicon nitride or the like, and the bonding layer 300 may be formed by deposition or the like.

In some embodiments, the dies 200 having the bonding layer 300 formed thereon are picked-and-placed onto the bonding layer 140 such that the bonding layer 300 is adhered to the bonding layer 140 through fusion bonding. The fusion bonding process may include a hydrophilic fusion bonding process, where a workable temperature is approximately greater than or substantially equal to about 100° C. and a workable pressure is approximately greater than or substantially equal to about 1 kg/cm². In some embodiments, the fusion bonding process does not involve metal to metal bonding. In some embodiments, the fusion bonded interface between the bonding layer 300 and the bonding layer 140 is substantially flat. For example, the fusion bonded interface has a roughness of less than 50 Å. In some embodiments, since the bonding layer 300 is fusion bonded to the bonding layer 140, these bonding layers may be rather thin as compared to the conventional adhesive layers. For example, a thickness of the bonding layer 300 may range between 100 Å and 1 μm. Similarly, a thickness of the bonding layer 140 may also range between 100 Å and 1 μm. As illustrated in FIG. 2A, the dies 200 are bonded to the carrier substrate 110 in a face down manner. That is, the interconnection structures 200 and the contact pads 240 of the dies 200 face the carrier substrate 110. In some embodiments, the dies 200 are arranged in an array.

As illustrated in FIG. 2A, the alignment marks 150 are arranged on a periphery region which surrounds a positioning location of the dies 200. In the other words, the alignment marks 150 are disposed within a region aside of a location where the dies 200 are disposed on. With the presence of the alignment marks 150, the transfer precision of the dies 200 onto the carrier substrate 110 may be effectively improved.

Figure 2B:
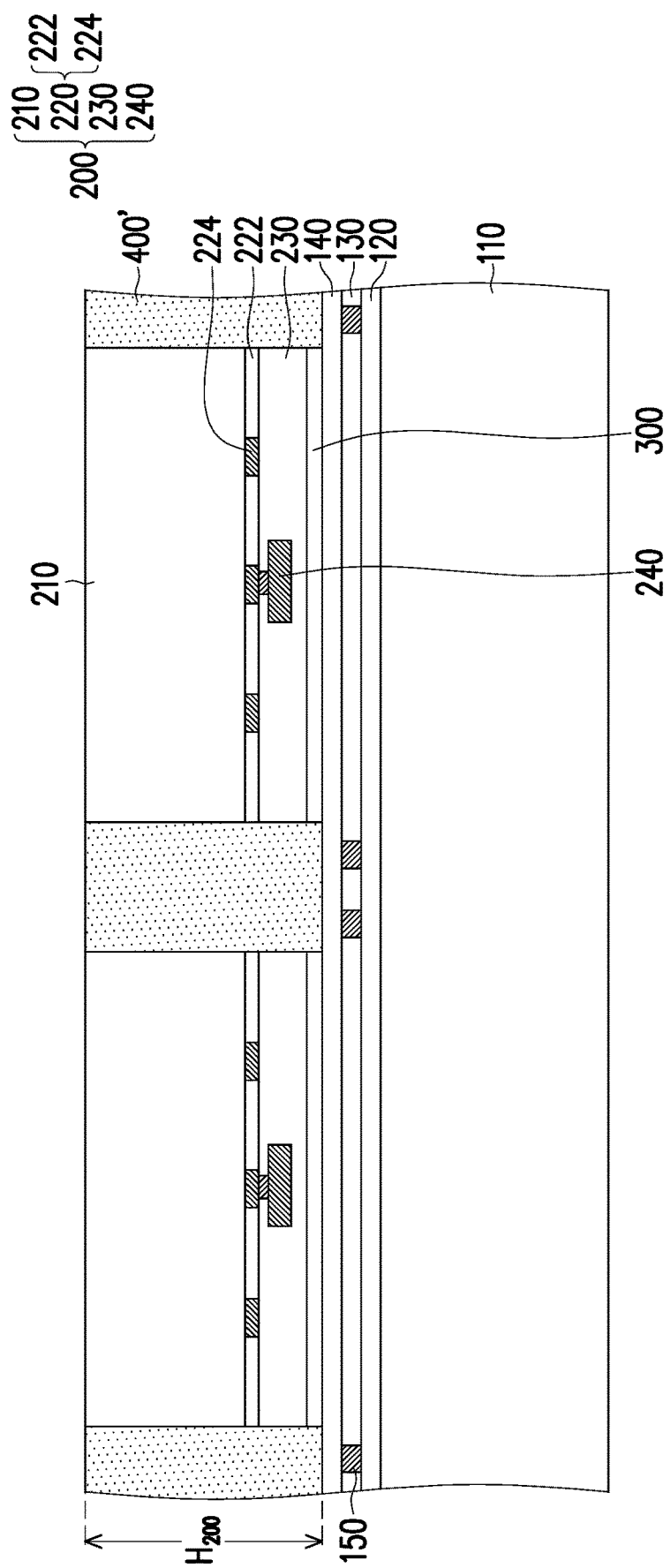

Referring to FIG. 2B, an insulating layer 400' is formed over the bonding layer 140 to laterally encapsulate the dies 200. In some embodiments, a material of the insulating layer 400' includes a molding compound, a polymeric material, such as polyimide, epoxy resin, acrylic resin, phenol resin, BCB, PBO, a combination thereof, or other suitable polymer-based dielectric materials. In some alternative embodiments, the insulating layer 400' may include silicon oxide and/or silicon nitride. In some embodiments, the insulating layer 400' further includes fillers. Alternatively, the insulating layer 400' may be free of fillers.

In some embodiments, the insulating layer 400' may be formed by the following steps. First, an insulating material (not shown) is formed over the bonding layer 140 to encapsulate the dies 200. At this stage, the semiconductor substrates 210' of the dies 200 are not revealed and are well protected by the insulating material. In some embodiments, the insulating material may be formed by a molding process (such as a compression molding process), a spin-coating process, a chemical vapor deposition (CVD) process, a plasma-enhanced chemical vapor deposition (PECVD) process, an atomic layer deposition (ALD) process, or the like. After the insulating material is formed, the insulating material is thinned until the semiconductor substrates 210' of the dies 200 are exposed. In some embodiments, the semiconductor substrates 210' and the insulating material are further thinned to reduce the overall thickness of the dies 200. In some embodiments, the insulating material and the semiconductor substrates 210' may be thinned or planarized through a grinding process, such as a mechanical grinding process, a CMP process, or the like. After the thinning process, each die 200 has a thinned semiconductor substrate 210 and the insulating layer 400' is formed to expose the semiconductor substrate 210. That is, top surfaces of the semiconductor substrates 210 are substantially coplanar with a top surface of the insulating layer 400'. In some embodiments, the insulating layer 400' may be referred to as "gap fill oxide." After the thinning process, each die 200 has a thickness $H_{200}$ of about 5 μm to about 100 μm. It should be noted that the foregoing process merely serves as an exemplary illustration, and the disclosure is not limited thereto. In some alternative embodiments, the insulating layer 400' may be formed after the semiconductor substrates 210 are thinned.

Figure 2C:
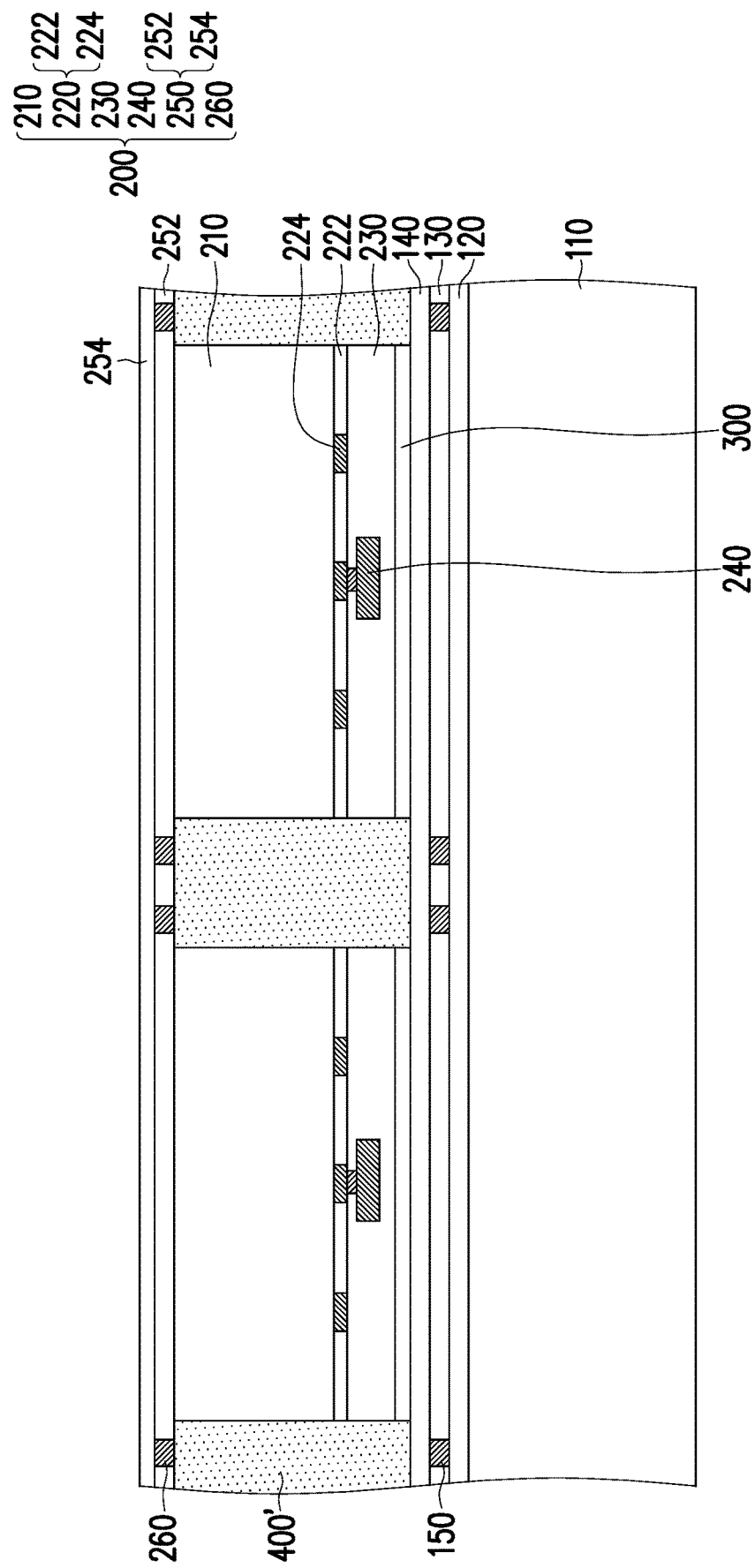

Referring to FIG. 2C, a bonding layer 250 is formed on the dies 200 and the insulating layer 400' opposite to the carrier substrate 110. In some embodiments, the bonding layer 250 includes a first sub-layer 252 and a second sub-layer 254 sequentially disposed on the semiconductor substrates 210 of the dies 200 and the insulating layer 400'. For example, the first sub-layer 252 is attached to the insulating layer 400' and the semiconductor substrate 210. In some embodiments, the first sub-layer 252 may be formed by suitable fabrication techniques, such as vapor deposition, spin coating, atomic layer deposition (ALD), thermal oxidation, some other suitable deposition or growth process, or a combination thereof. The vapor deposition may include, for example, chemical vapor deposition (CVD), physical vapor deposition (PVD), some other suitable vapor deposition process, or a combination thereof. In some embodiments, a material of the first sub-layer 252 includes polyimide, polybenzoxazole (PBO), benzocyclobutene (BCB), a nitride such as silicon nitride, an oxide such as silicon oxide, undoped silicate glass (USG), phosphosilicate glass (PSG), borosilicate glass (BSG), boron-doped phosphosilicate glass (BPSG), a combination thereof, or the like.

As illustrated in FIG. 2C, a plurality of alignment marks 260 are embedded in the first sub-layer 252. That is, the alignment marks 260 are embedded in the bonding layer 250. The alignment marks 260 is similar to the alignment marks 150, so the detailed description thereof is omitted herein. As illustrated in FIG. 2C, the alignment marks 260 are arranged on a periphery region which surrounds the positioning location of the dies 200. In the other words, the alignment marks 260 are disposed outside of the span of the dies 200. In some embodiments, the alignment marks 260 are directly located on the insulating layer 400'. In other words, the alignment marks 260 are directly in contact with the insulating layer 400'.

In some embodiments, the second sub-layer 254 of the bonding layer 250 may be utilized for bonding purposes in the subsequent processes. In some embodiments, the second sub-layer 254 is a smooth layer having a continuous even surface and overlaid on the first sub-layer 252 and the alignment marks 260. In some embodiments, a material of the second sub-layer 254 may include silicon oxynitride (SiON), silicon oxide, silicon nitride or the like, and the second sub-layer 254 may be formed by deposition or the like. In some embodiments, the second sub-layer 254 has a substantially uniform and even thickness. In some embodiments, a thickness of the second sub-layer 254 may range between 100 Å and 1 μm. In some embodiments, the bonding layer 250 and the alignment marks 260 may be considered as part of the dies 200.

Figure 2D:
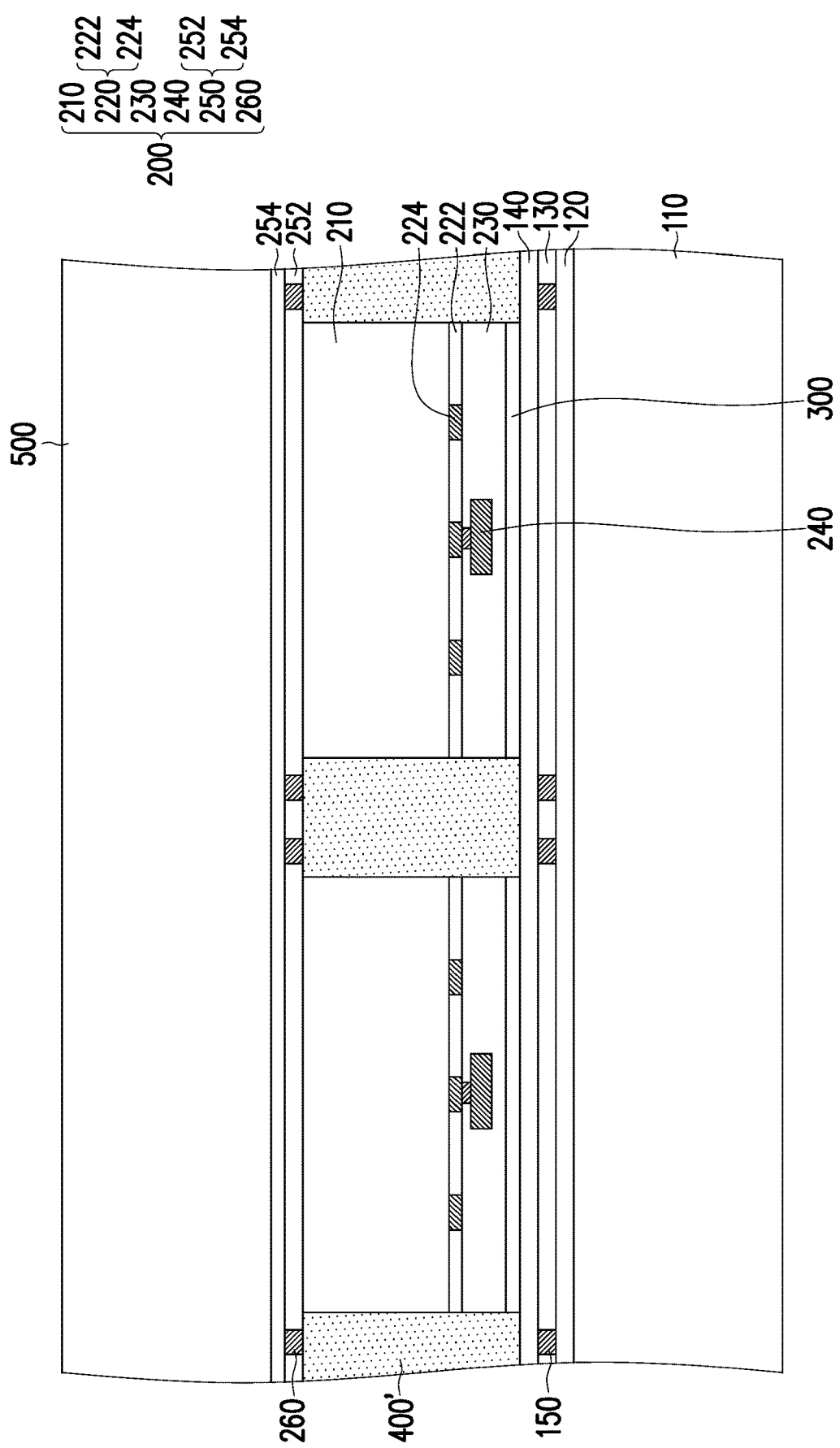

Referring to FIG. 2D, the bonding layer 250 is attached to a carrier substrate 500 opposite to the carrier substrate 110. That is, the dies 200 are bonded to the carrier substrate 500, and the carrier substrates 110, 500 are located on two opposite sides of the dies 200. In some embodiments, the carrier substrate 500 is similar to the carrier substrate 110, so the detailed description thereof is omitted herein. In some embodiments, the carrier substrate 500 is adhered to the bonding layer 250 through fusion bonding. The fusion bonding process may include a hydrophilic fusion bonding process, where a workable temperature is approximately greater than or substantially equal to about 100° C. and a workable pressure is approximately greater than or substantially equal to about 1 kg/cm$^2$. It should be noted that since the dies 200 are arranged on the carrier substrate 110 in a wafer form and the carrier substrate 500 is in wafer form as well, the bonding between the dies 200 and the carrier substrate 500 may be considered as a wafer-level process. That is, the bonding between the dies 200 and the carrier substrate 500 is a wafer-to-wafer bonding process. In some embodiments, with the presence of the alignment marks 260, the wafer-to-wafer bonding precision may be effectively improved.

Figure 2E:
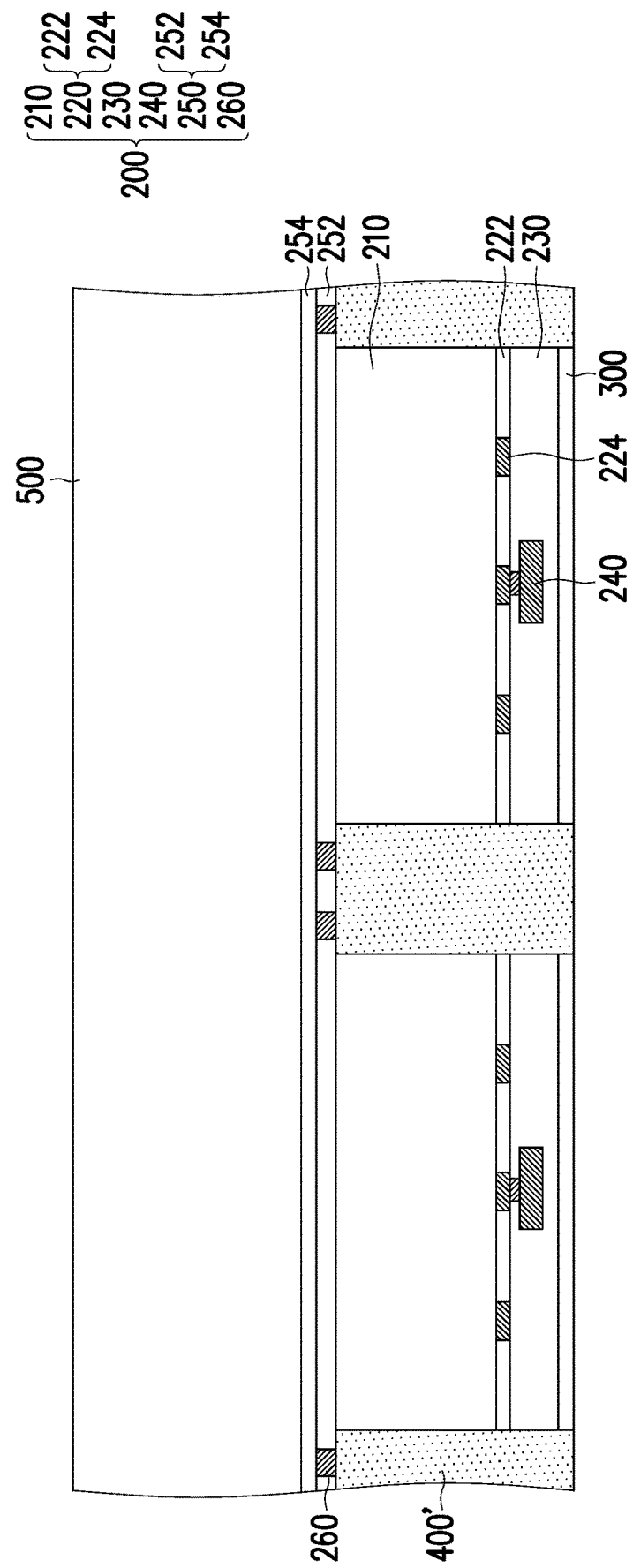

Referring to FIG. 2D and FIG. 2E, the carrier substrate 110, the dielectric layer 120, the dielectric layer 130, the bonding layer 140, and the alignment marks 150 are removed from the dies 200, the bonding layer 300, and the insulating layer 400'. For example, as illustrated in FIG. 2E, the insulating layer 400' and the bonding layer 300 are exposed. In some embodiments, the carrier substrate 110, the dielectric layer 120, the dielectric layer 130, the bonding layer 140, and the alignment marks 150 are removed through a planarization process, an etching process, a stripping process, the like, or a combination thereof.

Figure 2F:
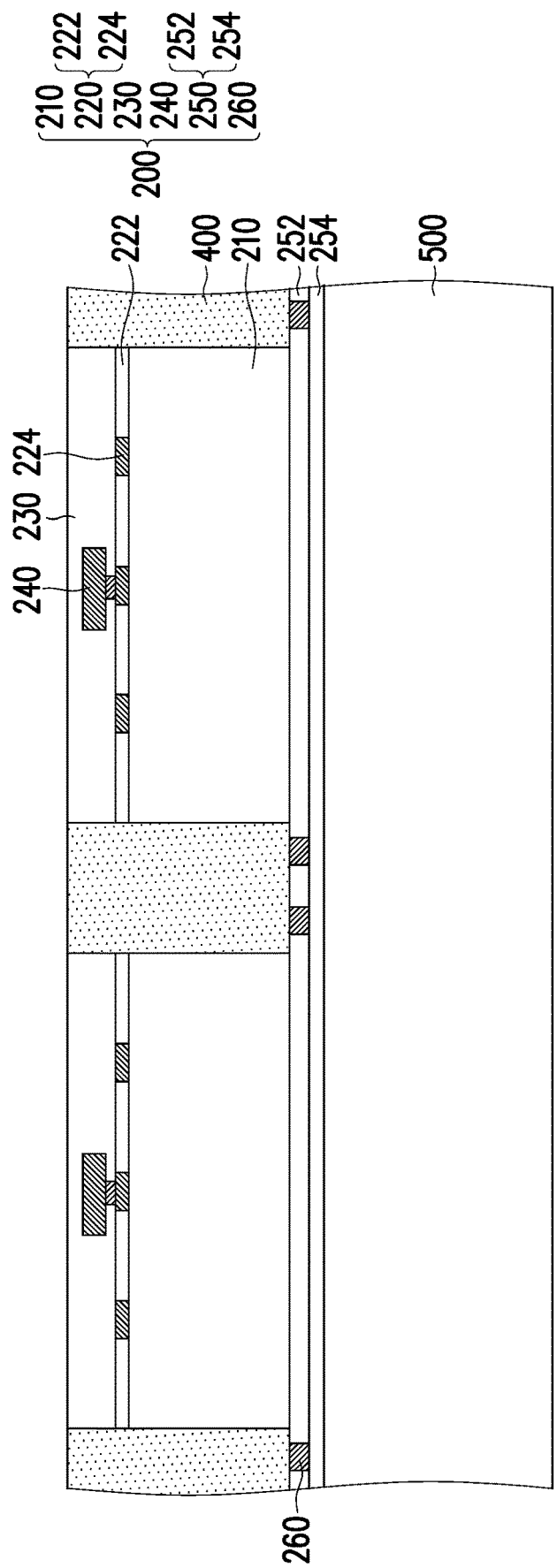

Referring to FIG. 2E and FIG. 2F, the bonding layer 300 and portions of the insulating layer 400' are further removed to form an insulating layer 400 surrounding the semiconductor substrate 210, the interconnection structure 220, and the passivation layer 230. For example, as illustrated in FIG. 2F, the passivation layers 230 of the dies 200 are exposed. In some embodiments, the bonding layer 300 and portions of the insulating layer 400' are removed through a planarization process, an etching process, the like, or a combination thereof. It should be noted that in some alternative embodiments, the step illustrated in FIG. 2F is optional. That is, in some alternative embodiments, the subsequent processes may be performed without removing the bonding layer 300.

Figure 2G:
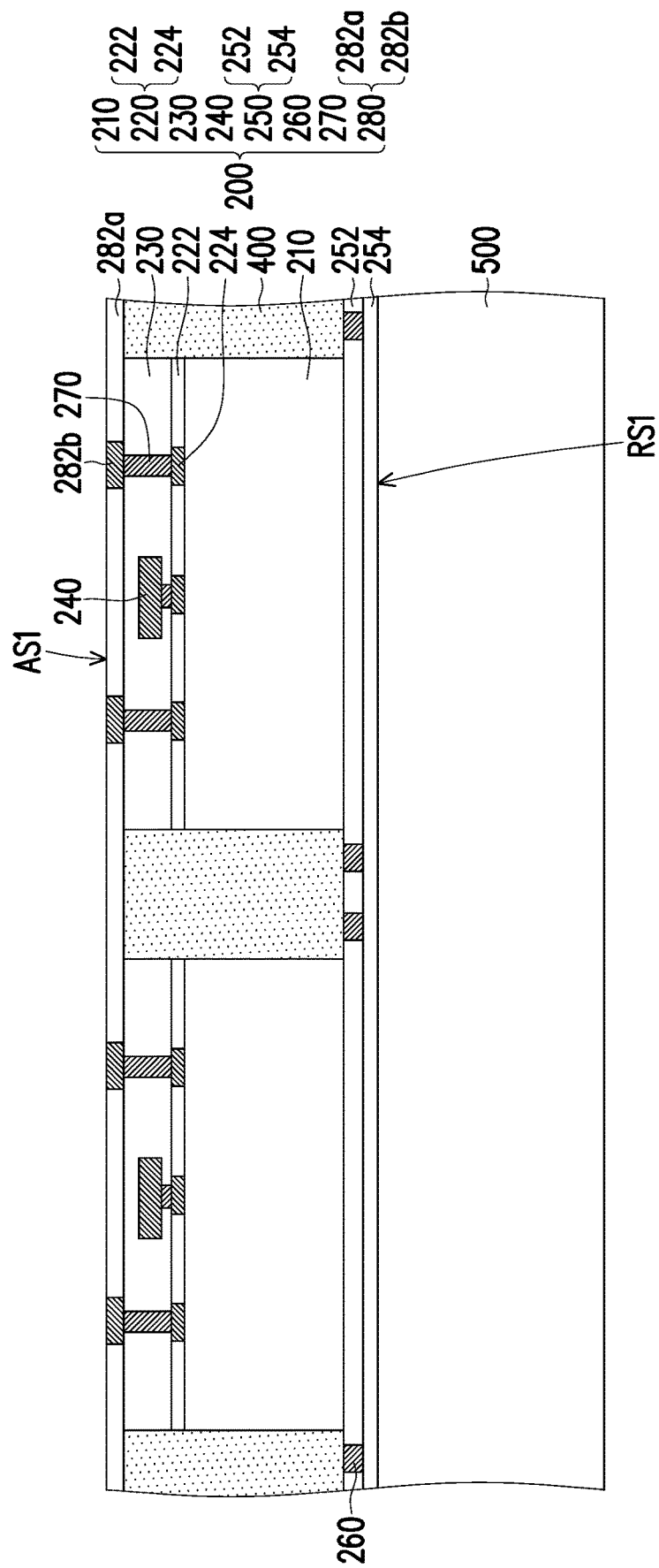

Referring to FIG. 2G, a plurality of bonding vias 270 and a bonding layer 280 are formed. In some embodiments, the bonding vias 270 are formed to penetrate through the passivation layer 230 to establish electrical connection with the conductive patterns 224 of the interconnection structure 220. The bonding layer 280 is formed on the dies 200 and the insulating layer 400'. For example, the bonding layer 280 is stacked on the passivation layer 230, the bonding vias 270, and the insulating layer 400. In some embodiments, the bonding layer 280 is opposite to the bonding layer 250. In some embodiments, the bonding layer 280 includes a dielectric layer 282a and a plurality of bonding pads 282b embedded in the dielectric layer 282a. In some embodiments, the bonding pads 282b of the bonding layer 280 are electrically connected to the bonding vias 270. That is, the bonding vias 270 electrically connect the interconnection structure 220 and the bonding pads 282b of the bonding layer 280.

In some embodiments, the bonding vias 270 and the bonding pads 282b may be formed via a dual damascene process. For example, the dielectric layer 282a is first formed on the passivation layer 230. In some embodiments, a material of the dielectric layer 282a includes oxides, such as silicon oxide or the like. Alternatively, the dielectric layer 282a may include polyimide, epoxy resin, acrylic resin, phenol resin, benzocyclobutene (BCB), polybenzoxazole (PBO), or any other suitable polymer-based dielectric material. The dielectric layer 282a, for example, may be formed by suitable fabrication techniques, such as spin-on coating, CVD, PECVD, or the like. Subsequently, trenches and via holes (not shown) are formed in the dielectric layer 282a and the passivation layer 230 by removing portions of theses layers. In some embodiments, a width of the trench is greater than a width of the via hole. Thereafter, a conductive material (not shown) is filled into the trenches and the via holes to form the bonding pads 282b and the bonding vias 270, respectively. In some embodiments, the bonding vias 270 and the bonding pads 282b are formed by simultaneously filling via holes and overlying trenches (not shown). In some alternative embodiments, the bonding vias 270 may be formed before the dielectric layer 282a and the bonding pads 282b. In some embodiments, a width of each bonding pad 282b may be greater than a width of each underlying bonding via 270. In some embodiments, the bonding vias 270 and the bonding pads 282b include the same material. Materials for the bonding vias 270 and the bonding pads 282b are, for example, aluminum, titanium, copper, nickel, tungsten, or alloys thereof. In some embodiments, the bonding vias 270 and the bonding layer 280 may be considered as part of the dies 200.

In some embodiments, top surfaces of the bonding pads 282b and a top surface of the dielectric layer 282a may be collectively referred to as active surfaces AS1 of the dies 200. On the other hand, the surface of the bonding layer 250 facing the carrier substrate 500 may be referred to as rear surfaces RS1 of the dies 200. As shown in FIG. 2G, the top surfaces of the bonding pads 282b and the top surface of the dielectric layer 282a are substantially located at the same level height to provide an appropriate active surfaces AS1 for hybrid bonding. Although not illustrated, in some embodiments, some of the bonding vias 270 and some of the bonding pads 282b may be disposed directly above the conductive pads 240 to establish electrical connection between the conductive pads 240 and other elements. That is, in some embodiments, some of the conductive pads 240 are electrically floating while some of the conductive pads 240 are able to transmit signal.

Figure 2H:
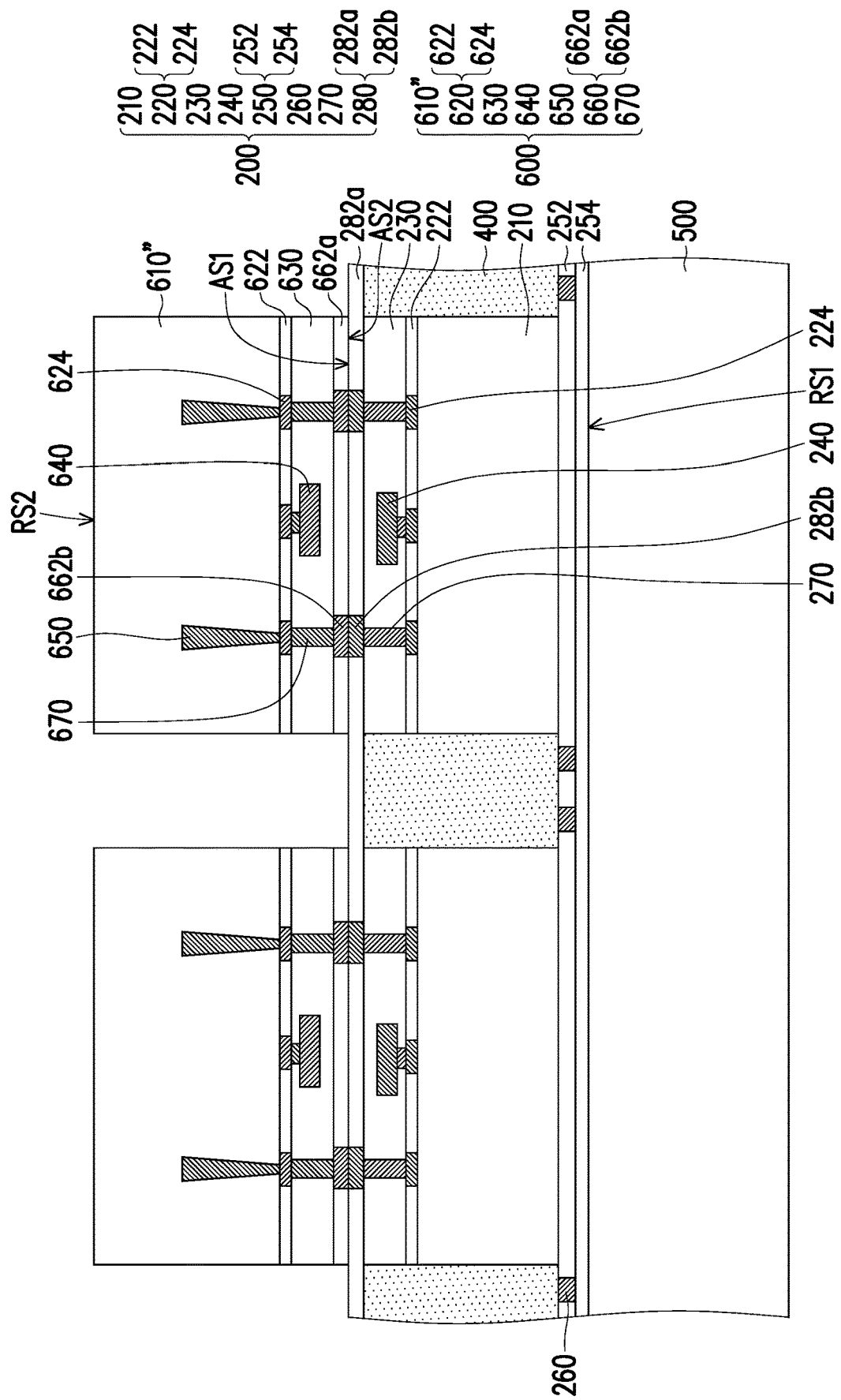

Referring to FIG. 2H, a plurality of dies 600 are provided. In some embodiments, each die 600 includes a semiconductor substrate 610", an interconnection structure 620, a passivation layer 630, a conductive pad 640, a plurality of through semiconductor vias (TSV) 650, a bonding layer 660, and a plurality of bonding vias 670. In some embodiments, the semiconductor substrates 610" of the die 600 in FIG. 2H is similar to the semiconductor substrate 210' of the die 200 in FIG. 2A, so the detailed descriptions thereof is omitted herein. As illustrated in FIG. 2H, the interconnection structure 620 is disposed on the semiconductor substrate 610". In some embodiments, the interconnection structure 620 includes an inter-dielectric layer 622 and a plurality of conductive patterns 624. The inter-dielectric layer 622 and the conductive patterns 624 of the interconnection structure 620 are respectively similar to the inter-dielectric layer 222 and the conductive patterns 224 of the interconnection structure 220, so the detailed descriptions thereof are omitted herein.

In some embodiments, the conductive pad 640 is disposed over and electrically connected to the interconnection structure 620. On the other hand, the passivation layer 630 is formed over the interconnection structure 620 to seal the conductive pad 640. The passivation layer 630 and the conductive pad 640 of the die 600 are respectively similar to the passivation layer 230 and the conductive pad 240 of the die 200, so the detailed descriptions thereof are omitted herein.

As illustrated in FIG. 2H, the TSVs 650 are embedded in the semiconductor substrate 610". In some embodiments, the TSVs 650 are directly in contact with the conductive patterns 624 to render electrical connection with the interconnection structure 620. In some embodiments, the bonding vias 670 penetrate through the passivation layer 630 to establish electrical connection with the conductive patterns 624 of the interconnection structure 620. The bonding layer 660 is formed on the passivation layer 630 and the bonding vias 670. In some embodiments, the bonding layer 660 includes a dielectric layer 662a and a plurality of bonding pads 662b embedded in the dielectric layer 662a. In some embodiments, the bonding pads 662b of the boning layer 660 are electrically connected to the bonding vias 670. That is, the bonding vias 670 electrically connect the interconnection structure 620 and the bonding pads 662b of the bonding layer 660. The bonding layer 660 and the bonding vias 670 are respectively similar to the bonding layer 280 and the bonding vias 270, so the detailed descriptions thereof are omitted herein.

In some embodiments, the dies 600 may be capable of performing storage functions. For example, the dies 600 may be Dynamic Random Access Memory (DRAM), Resistive Random Access Memory (RRAM), Static Random Access Memory (SRAM), or the like. However, the disclosure is not limited thereto. In some alternative embodiments, the dies 600 may be Central Process Unit (CPU) dies, Graphic Process Unit (GPU) dies, Field-Programmable Gate Array (FPGA), or the like.

As illustrated in FIG. 2H, bottom surfaces of the bonding pads 662b and a bottom surface of the dielectric layer 662a may be collectively referred to as active surfaces AS2 of the dies 600. On the other hand, surfaces of the dies 600 opposite to the active surfaces AS2 may be referred to as rear surfaces RS2 of the dies 600. As shown in FIG. 2H, the bottom surfaces of the bonding pads 662b and the bottom surface of the dielectric layer 662a are substantially located at the same level height to provide an appropriate active surfaces AS2 for hybrid bonding.

As illustrated in FIG. 2H, the dies 600 are individually placed on the corresponding dies 200 such that each die 600 is bonded to the corresponding die 200. In some embodiments, each die 600 may be bonded to the corresponding die 200 through a hybrid bonding process. In some embodiments, a temperature of the hybrid bonding process ranges from about 150° C. to about 400° C. The hybrid bonding process will be described in detail below.

In some embodiments, the dies 600 may be picked-and-placed onto the active surfaces AS1 of the dies 200 such that the dies 600 are electrically connected to the dies 200. In some embodiments, the dies 600 are placed such that the active surfaces AS2 of the dies 600 are in contact with the active surfaces AS1 of the dies 200. Meanwhile, the bonding pads 662b of the dies 600 are substantially aligned and in direct contact with the corresponding bonding pads 282b of the dies 200. In some embodiments, to facilitate the hybrid bonding between the dies 600 and the dies 200, surface preparation for bonding surfaces (i.e. the active surfaces AS1 and the active surfaces AS2) of the dies 600 and the dies 200 may be performed. The surface preparation may include surface cleaning and activation, for example. Surface cleaning may be performed on the active surfaces AS1, AS2 to remove particles on the bonding surface of the dielectric layer 282a, the bonding surfaces of the bonding pads 282b, the bonding surface of the dielectric layer 662a, and the bonding surfaces of the bonding pads 662b. In some embodiments, the active surfaces AS1, AS2 may be cleaned by wet cleaning, for example. Not only particles are removed, but also native oxide formed on the bonding surfaces of the bonding pads 282b and the bonding pads 662b may be removed. The native oxide formed on the bonding surfaces of the bonding pads 282b and the bonding pads 662b may be removed by chemicals used in wet cleaning processes, for example.

After cleaning the active surfaces AS1 of the dies 200 and the active surfaces AS2 of the dies 600, activation of the bonding surfaces of the dielectric layer 282a and the dielectric layer 662a may be performed for development of high bonding strength. In some embodiments, plasma activation may be performed to treat the bonding surfaces of the dielectric layer 282a and the dielectric layer 662a. When the activated bonding surface of the dielectric layer 282a is in contact with the activated bonding surface of the dielectric layer 662a, the dielectric layer 282a of the dies 200 and the dielectric layer 662a of the dies 600 are pre-bonded.

After pre-bonding the dies 600 onto the dies 200, hybrid bonding of the dies 600 and the dies 200 is performed. The hybrid bonding of the dies 600 and the dies 200 may include a thermal treatment for dielectric bonding and a thermal annealing for conductor bonding. In some embodiments, the thermal treatment for dielectric bonding is performed to strengthen the bonding between the dielectric layer 282a and the dielectric layer 662a. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 282b and the bonding pads 662b. For example, the thermal annealing for conductor bonding may be performed at temperature ranging from about 150° C. to about 400° C. After performing the thermal annealing for conductor bonding, the dielectric layer 282a is hybrid bonded to the dielectric layer 662a and the bonding pads 282b are hybrid bonded to the bonding pads 662b. For example, the dielectric layer 282a is directly in contact with the dielectric layer 662a. Similarly, the bonding pads 282b are directly in contact with the bonding pads 662b. As such, the bonding layer 280 of the dies 200 is hybrid bonded to the bonding layer 660 of the dies 600. Although FIG. 2H illustrated that the bonding pads 282b and the bonding pads 662b have sharp corners (the sidewalls are perpendicular to the top/bottom surfaces), the disclosure is not limited thereto. In some alternative embodiments, after the bonding pads 282b are hybrid bonded to the bonding pads 662b, corner rounding of the bonding pads may occur. For example, the corners of the bonding pads 282b facing the bonding pads 662b are rounded. Similarly, the corners of the bonding pads 662b facing the bonding pads 282b are also rounded. That is, edges of the top surface of each bonding pad 282b are rounded. Similarly, edges of the bottom surface of each bonding pad 662b are also rounded.

In some embodiments, since the active surfaces AS1 of the dies 200 are hybrid bonded to the active surfaces AS2 of the dies 600, the bonding between the dies 200 and the dies 600 may be considered as face-to-face bonding. In some embodiments, with the presence of the alignment marks 260, the bonding precision may be effectively improved. That is, with the aid of the alignment marks 260, the alignment between the bonding pads 282b and the corresponding bonding pads 662b may be ensured. It should be noted that although FIG. 2H illustrated that the sizes (i.e. the widths)

of the dies 200 and the dies 600 are substantially identical, the disclosure is not limited thereto. In some alternative embodiments, the size of the dies 200 may differ from the size of the dies 600. For example, the size of the dies 200 may be larger than the size of the dies 600. Alternatively, the size of the dies 200 may be smaller than the size of the dies 600. Moreover, although FIG. 2H illustrated that the dies 200 and the dies 600 are bonded in a one-to-one manner, the disclosure is not limited thereto. Depending on the size of the die 200, multiple dies 600 may be bonded to one die 200.

Figure 2I:
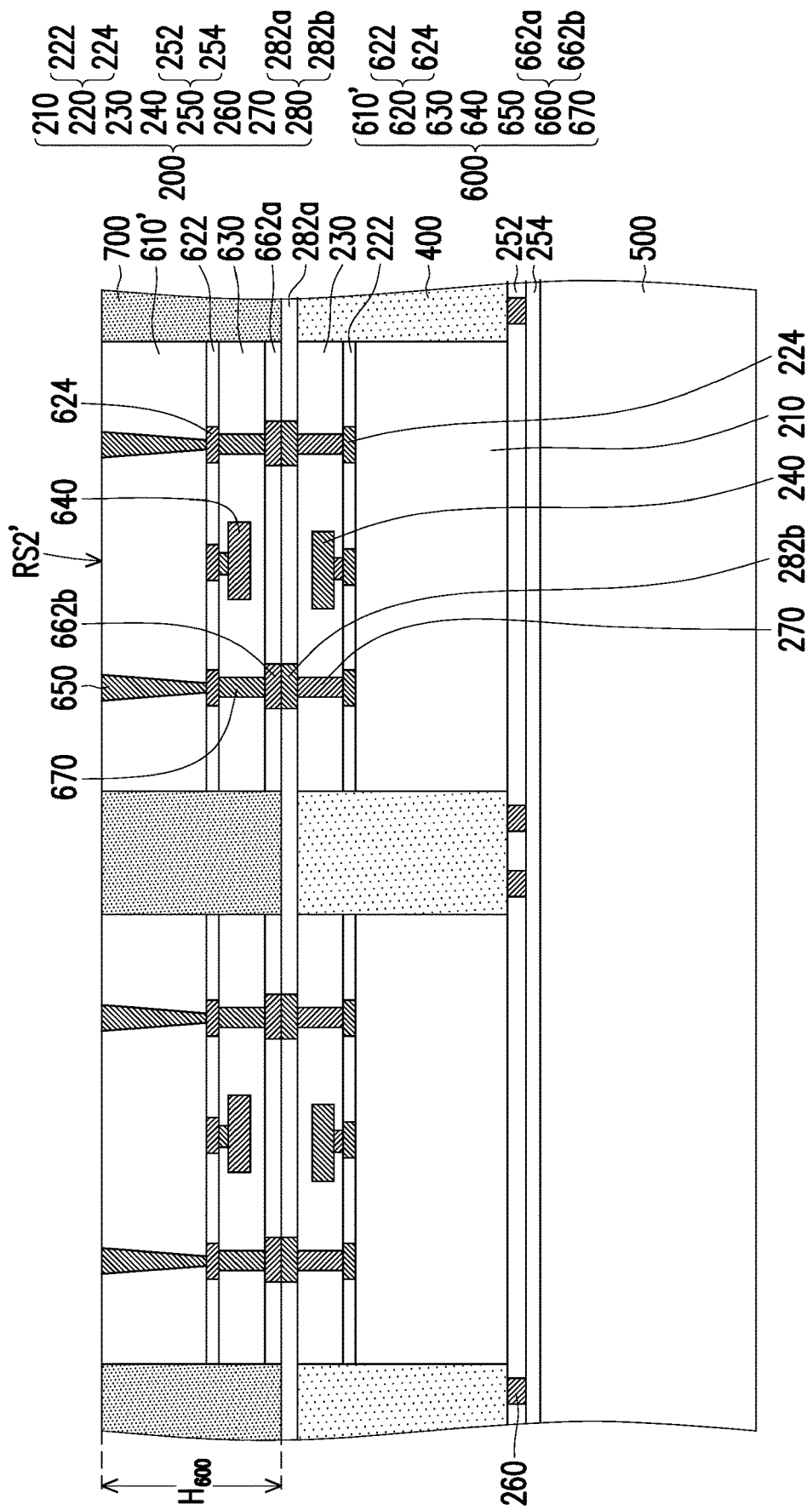

Referring to FIG. 2I, an insulating layer 700 is formed over the bonding layer 280 to laterally encapsulate the dies 600. In some embodiments, a material of the insulating layer 700 includes a molding compound, a polymeric material, such as polyimide, epoxy resin, acrylic resin, phenol resin, BCB, PBO, a combination thereof, or other suitable polymer-based dielectric materials. In some alternative embodiments, the insulating layer 700 may include silicon oxide and/or silicon nitride. In some embodiments, the insulating layer 700 further includes fillers. Alternatively, the insulating layer 700 may be free of fillers. In some embodiments, the insulating layer 700 may be formed by the following steps. First, an insulating material (not shown) is formed over the bonding layer 280 to encapsulate the dies 600. At this stage, the semiconductor substrates 610″ of the dies 600 are not revealed and are well protected by the insulating material. For example, the rear surface RS2 of the dies 600 are not revealed. In some embodiments, the insulating material may be formed by a molding process (such as a compression molding process), a spin-coating process, a chemical vapor deposition (CVD) process, a plasma-enhanced chemical vapor deposition (PECVD) process, an atomic layer deposition (ALD) process, or the like. After the insulating material is formed, the insulating material and the semiconductor substrate 610″ are thinned until the TSVs 650 are exposed. In some embodiments, the insulating material and the semiconductor substrates 610″ may be thinned or planarized through a grinding process, such as a mechanical grinding process, a CMP process, or the like. After the thinning process, each die 600 has a thinned semiconductor substrate 610′ and the insulating layer 700 is formed to expose rear surfaces RS2′ of the dies 600 and the TSVs 650. That is, rear surfaces RS2′ of the dies 600 are substantially coplanar with a top surface of the insulating layer 700. In some embodiments, the TSVs 650 penetrate through the semiconductor substrates 610′. In some embodiments, the insulating layer 700 may be referred to as "gap fill oxide." After the thinning process, each die 600 has a thickness $H_{600}$ of about 5 μm to about 100 μm. It should be noted that the foregoing process merely serve as an exemplary illustration, and the disclosure is not limited thereto. In some alternative embodiments, the insulating layer 700 may be formed after the semiconductor substrates 610″ are thinned to expose the TSVs 650.

Figure 2J:
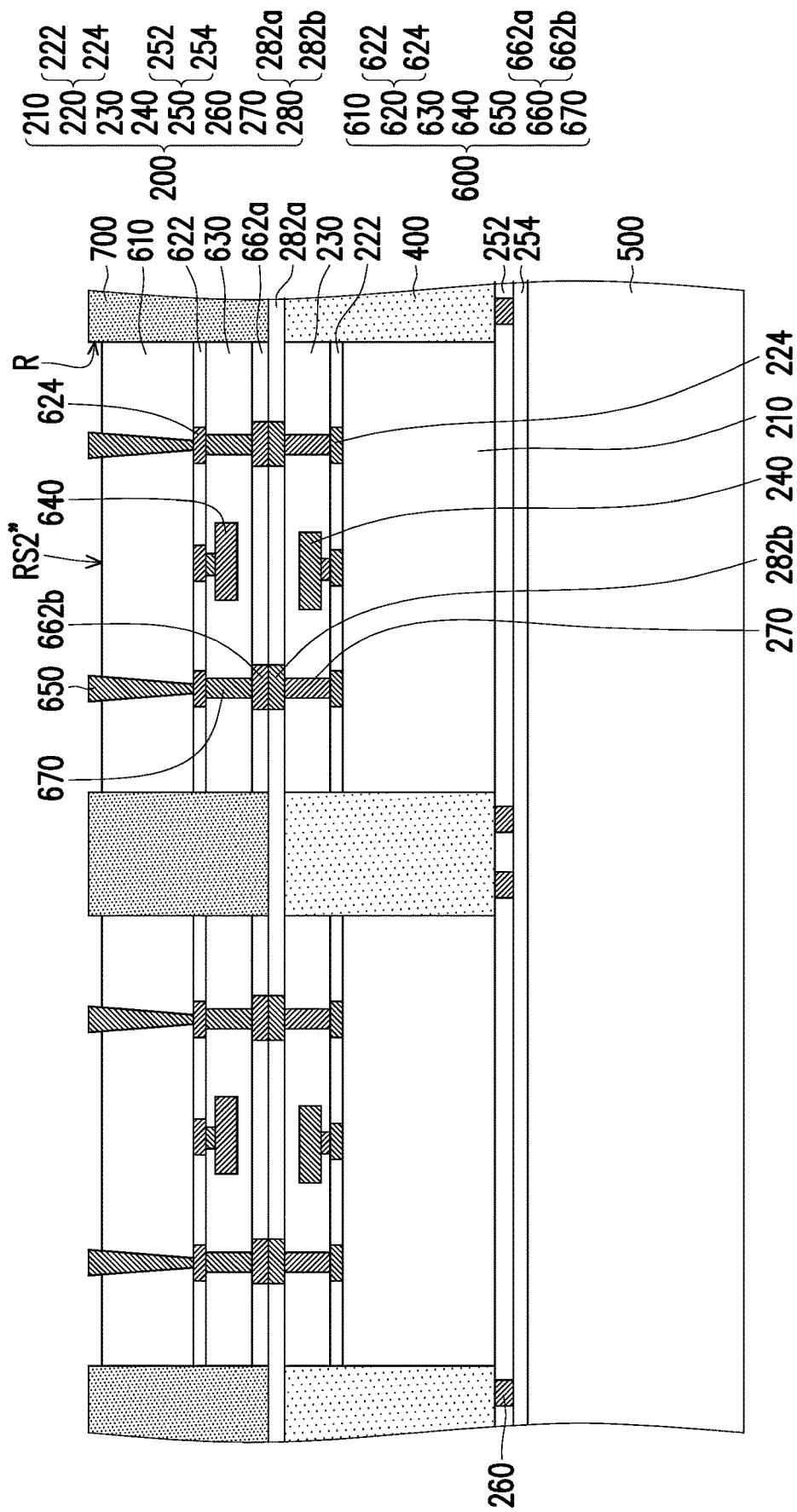

Referring to FIG. 2J, a portion of each die 600 is removed to form a plurality of recesses R. For example, a portion of each semiconductor substrate 610′ is removed to form the recesses R. As illustrated in FIG. 2J, the TSVs 650 are partially located in the recess R. In some embodiments, at least a portion of each TSV 650 protrudes from the semiconductor substrates 610 of the dies 600. That is, the top surfaces of the TSVs 650 are located at a level height higher than the rear surfaces RS2″ of the dies 600. In some embodiments, the semiconductor substrates 610′ may be partially removed through an etching process. The etching process includes, for example, an isotropic etching process and/or an anisotropic etching process. For example, the semiconductor substrates 610′ may be partially removed through a wet etching process, a dry etching process, or a combination thereof.

Figure 2K:
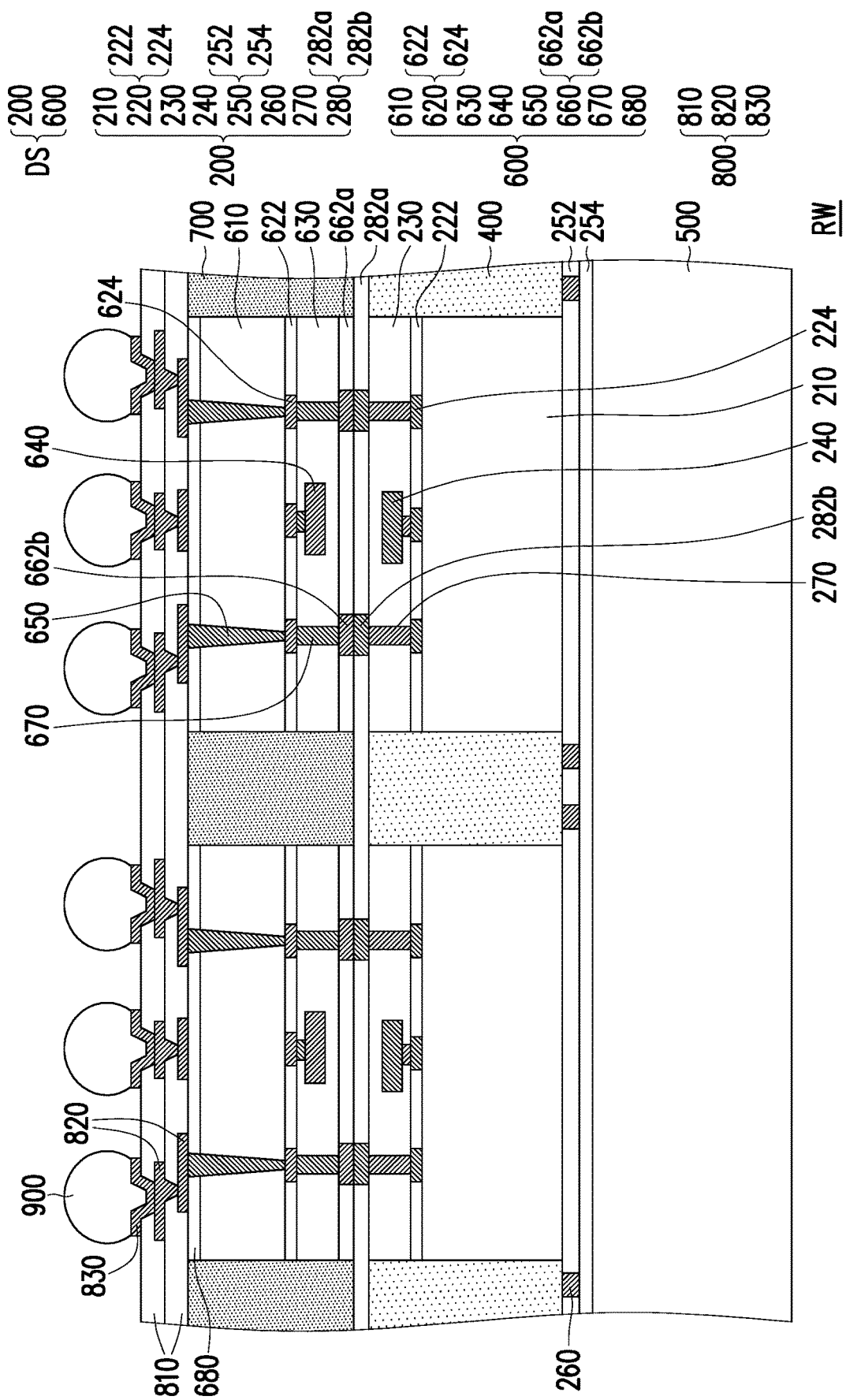

Referring to FIG. 2K, a protection layer 680 is formed to fill the recesses R. In some embodiments, the protection layer 680 includes a molding compound, a molding underfill, or the like. Alternatively, the protection layer 680 may be made of a polymeric material, such as polyimide, epoxy resin, acrylic resin, phenol resin, BCB, PBO, or other suitable polymer-based dielectric materials. In some embodiments, the protection layer 680 may include fillers. Alternatively, the protection layer 680 may be free of fillers. As illustrated in FIG. 2K, the protruding portion of each TSV 650 is laterally encapsulated by the protection layer 680. The insulating layer 700 surrounds the semiconductor substrate 610, the interconnection structure 620, the passivation layer 630, the bonding layer 660, and the protection layer 680. In some embodiments, the protection layer 680 may be considered as part of the dies 600. In some embodiments, the die 200 and the corresponding die 600 disposed thereon may be collectively referred to as the die stack DS.

As illustrated in FIG. 2K, a redistribution structure 800 and a plurality of conductive terminals 900 are sequentially formed on the insulating layer 700 and the dies 600 to obtain the reconstructed wafer RW. In some embodiments, the redistribution structure 800 includes a plurality of dielectric layers 810 and a plurality of redistribution conductive layers 820. The redistribution conductive layers 820 may include a plurality of redistribution conductive patterns. In some embodiments, each redistribution conductive layer 820 is sandwiched between two adjacent dielectric layers 810. Portions of the redistribution conductive layers 820 may extend vertically within the dielectric layer 810 to establish electrical connection with other overlying or underlying redistribution conductive layers 820. In some embodiments, a material of the redistribution conductive layers 820 includes aluminum, titanium, copper, nickel, tungsten, combinations thereof, or other suitable conductive materials. For example, the bottommost redistribution conductive layer 820 may include a plurality of copper traces while the topmost redistribution conductive layer 820 may include a plurality of aluminum pads. However, the disclosure is not limited thereto. The redistribution conductive layers 820 may be formed by, for example, electroplating, deposition, and/or photolithography and etching. In some embodiments, a material of the dielectric layer 810 includes polyimide, epoxy resin, acrylic resin, phenol resin, benzocyclobutene (BCB), polybenzooxazole (PBO), or any other suitable polymer-based dielectric material. The dielectric layer 810, for example, may be formed by suitable fabrication techniques, such as spin-on coating, chemical vapor deposition (CVD), plasma-enhanced chemical vapor deposition (PECVD), or the like. It should be noted that the number of the dielectric layers 810 and the number of the redistribution conductive layers 820 illustrated in FIG. 2K are merely for illustrative purposes, and the disclosure is not limited thereto. In some alternative embodiments, the number of the dielectric layers 810 and the number of the redistribution conductive layers 820 may be varied depending on the circuit design. In some embodiments, the redistribution structure 800 is electrically connected to the TSVs 650. For example, the bottommost redistribution conductive layer 820 physically contact the TSVs 650 to establish electrical connection with the dies 600.

In some embodiments, the redistribution structure 800 further includes a plurality of under-bump metallurgy (UBM) patterns 830. The UBM patterns 830 are electrically connected to the redistribution conductive layers 820. In some embodiments, the UBM patterns 830 are electrically connected to the TSVs 650 through the redistribution conductive layers 820. In some embodiments, each of the UBM patterns 830 is partially embedded in the topmost dielectric layer 810.

As illustrated in FIG. 2K, the conductive terminals 900 are disposed on the UBM patterns 830. In some embodiments, the conductive terminals 900 are attached to the UBM patterns 830 through a solder flux. In some embodiments, the conductive terminals 900 are, for example, solder balls, ball grid array (BGA) balls, or controlled collapse chip connection (C4) bumps. In some embodiments, the conductive terminals 900 are made of a conductive material with low resistivity, such as Sn, Pb, Ag, Cu, Ni, Bi, or an alloy thereof.

In some embodiments, since known good dies are assembled to the reconstructed wafer RW, the yield of the reconstructed wafer RW may be sufficiently increased at a lower cost. Moreover, by providing die stacks DS in the reconstructed wafer RW, the flexibility in chip size, chip thickness, and chip function integration may be effectively increased. Furthermore, by forming the reconstructed wafer RW with the foregoing process, the pitch of the redistribution conductive patterns in the redistribution structure 800 may be reduced to less than 0.8 μm, thereby achieving fine pitch configuration with larger I/O (input/output) connection.

Figure 3:
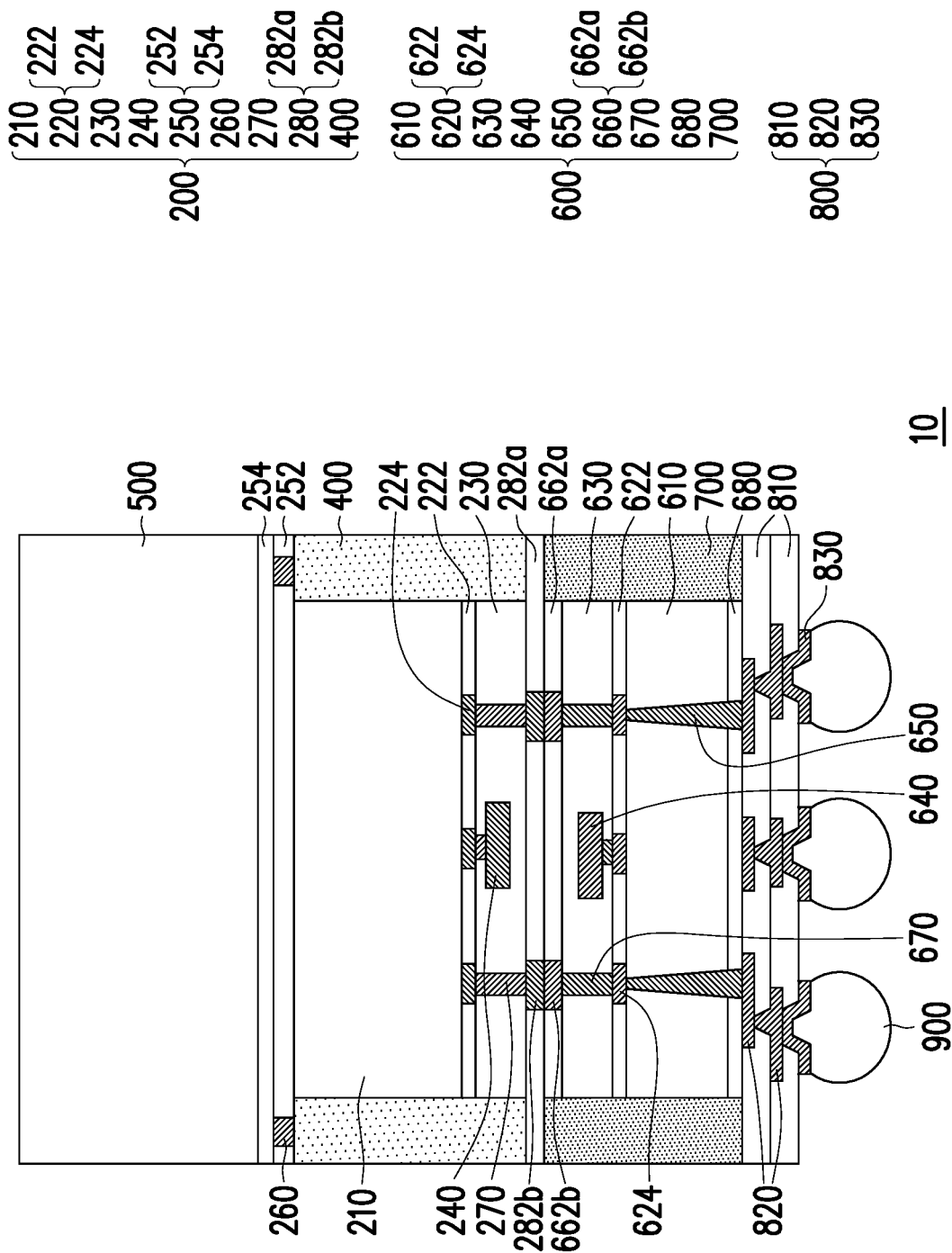
FIG. 3 is a schematic cross-sectional view illustrating a package in accordance with some embodiments of the disclosure.

As mentioned above, the reconstructed wafer RW may undergo further processing to obtain a plurality of packages. FIG. 3 is a schematic cross-sectional view illustrating a package 10 in accordance with some embodiments of the disclosure. Referring to FIG. 3, a singulation process is performed on the reconstructed wafer RW illustrated in FIG. 2K to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the dielectric layers 810, the insulating layer 700, the dielectric layer 282a, the insulating layer 400, the first sub-layer 252, the second sub-layer 254, and the carrier substrate 500 are being cut through. In some embodiments, after the singulation process, the insulating layer 400 may be considered as part of the die 200 while the insulating layer 700 may be considered as part of the die 600.

As illustrated in FIG. 3, the die 200 is stacked on the die 600. In other words, multiple dies 200, 600 are integrated into a single package 10. As such, the package 10 may be referred to as a "system on integrated circuit (SOIC) package." In some embodiments, the package 10 may be utilized in other modules/applications, such as chip on wafer on substrate (CoWoS) packaging, flip-chip packaging, integrated fan-out (InFO) packaging, fan-out wafer level packaging (WLP), or the like.

Figure 4A:
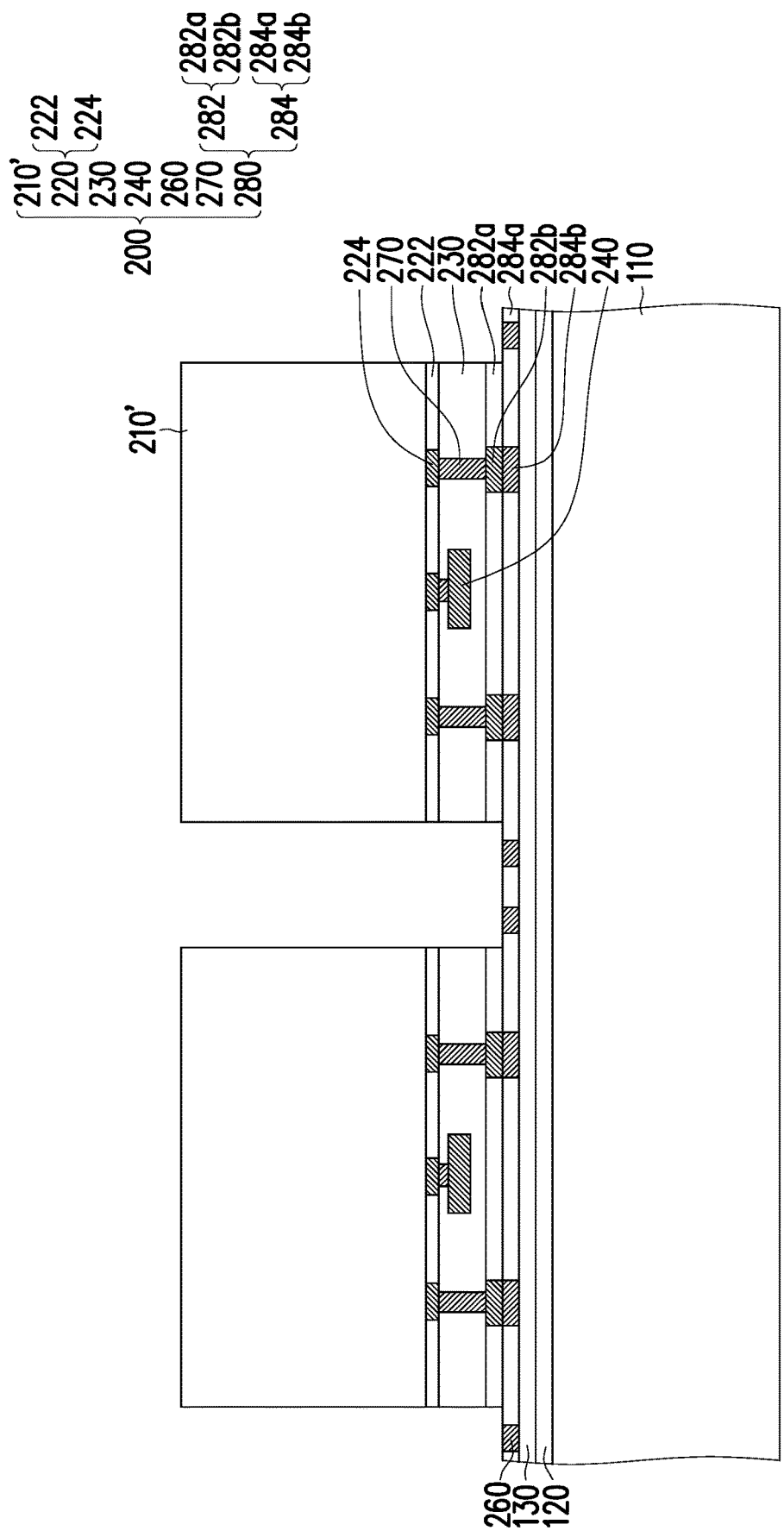
FIG. 4A to FIG. 4I are schematic cross-sectional view illustrating a manufacturing process of a reconstructed wafer in accordance with some alternative embodiments of the disclosure.

FIG. 4A to FIG. 4I are schematic cross-sectional view illustrating a manufacturing process of a reconstructed wafer RW1 in accordance with some alternative embodiments of the disclosure. Referring to FIG. 4A, a carrier substrate 110 is provided. A dielectric layer 120, a dielectric layer 130, and a bonding layer 284 are sequentially disposed on the carrier substrate 110. The carrier substrate 110, the dielectric layer 120, and the dielectric layer 130 in FIG. 4A are respectively similar to the carrier substrate 110, the dielectric layer 120, and the dielectric layer 130 in FIG. 2A, so the detailed descriptions thereof are omitted herein.

In some embodiments, the bonding layer 284 includes a dielectric layer 284a and a plurality of bonding pads 284b embedded in the dielectric layer 284a. In some embodiments, a material of the dielectric layer 284a includes oxides, such as silicon oxide or the like. Alternatively, the dielectric layer 284a may include polyimide, epoxy resin, acrylic resin, phenol resin, benzocyclobutene (BCB), polybenzoxazole (PBO), or any other suitable polymer-based dielectric material. The dielectric layer 284a, for example, may be formed by suitable fabrication techniques, such as spin-on coating, CVD, PECVD, or the like. Materials for the bonding pads 284b are, for example, aluminum, titanium, copper, nickel, tungsten, or alloys thereof. In some embodiments, a plurality of alignment marks 260 are embedded in the dielectric layer 284a. In some embodiments, the alignment marks 260 may be a patterned copper layer or other suitable patterned metal layer. In some embodiments, the alignment marks 260 may be formed by electroplating or deposition. It should be noted that the shapes and numbers of the alignment marks 260 are not limited in the disclosure, and may be designated based on the demand and/or design layout. In some embodiments, the alignment marks 260 are electrically isolated from other components. In other words, the alignment marks 260 are electrically floating.

As illustrated in FIG. 4A, a plurality of dies 200 is attached to the carrier substrate 110. In some embodiments, each die 200 includes a semiconductor substrate 210', an interconnection structure 220, a passivation layer 230, a conductive pad 240, a plurality of bonding vias 270, and a bonding layer 282. The semiconductor substrate 210', the interconnection structure 220, the passivation layer 230, and the conductive pad 240 in FIG. 4A are respectively similar to the semiconductor substrate 210', the interconnection structure 220, the passivation layer 230, and the conductive pad 240 in FIG. 2A, so the detailed descriptions thereof are omitted herein. On the other hand, the bonding vias 270 and the bonding layer 282 in FIG. 4A are respectively similar to the bonding vias 270 and the bonding layer 280 in FIG. 2G, so the detailed descriptions thereof are omitted herein.

In some embodiments, the dies 200 may be capable of performing logic functions. For example, the dies 200 may be Central Process Unit (CPU) dies, Graphic Process Unit (GPU) dies, Field-Programmable Gate Array (FPGA), or the like.

In some embodiments, the dies 200 are picked-and-placed onto the bonding layer 284 such that the bonding layer 282 is adhered to the bonding layer 284 through hybrid bonding. The hybrid bonding process in FIG. 4A may be similar to the hybrid bonding process shown in FIG. 2H, so the detailed description thereof is omitted herein. In some embodiments, the dielectric layer 282a of the bonding layer 282 is hybrid bonded to the dielectric layer 284a of the bonding layer 284. Meanwhile, the bonding pads 282b of the bonding layer 282 are hybrid bonded to and are aligned with the bonding pads 284b of the bonding layer 284. After hybrid bonding the bonding layer 284 to the dies 200, the alignment marks 260 and the bonding layer 284 may be considered as part of the dies 200. That is, the bonding layer 284 and the alignment marks 260 are transferred onto the dies 200. In some embodiments, the bonding layer 282 and the bonding layer 284 may be collectively referred to as a bonding layer 280. That is, the bonding layer 282 may be referred to as a first sub-layer of the bonding layer 280 while the bonding layer 284 may be referred to as a second sub-layer of the bonding layer 280. In some embodiments, the first sub-layer of the bonding layer 280 is hybrid bonded to the second sub-layer of the bonding layer 280, and the alignment marks 260 are embedded in the second sub-layer.

In some embodiments, the dies 200 are bonded to the carrier substrate 110 in a face down manner. That is, the interconnection structures 200 and the contact pads 240 of the dies 200 face the carrier substrate 110. In some embodiments, the dies 200 are arranged in an array. As illustrated in FIG. 4A, the alignment marks 260 are arranged on a periphery region which surrounds a positioning location of the dies 200. In the other words, the alignment marks 260 are disposed outside of the span of the dies 200. With the presence of the alignment marks 260, the bonding precision may be effectively improved. That is, with the aid of the alignment marks 260, the alignment between the bonding pads 282b and the corresponding bonding pads 284b may be ensured.

Figure 4B:
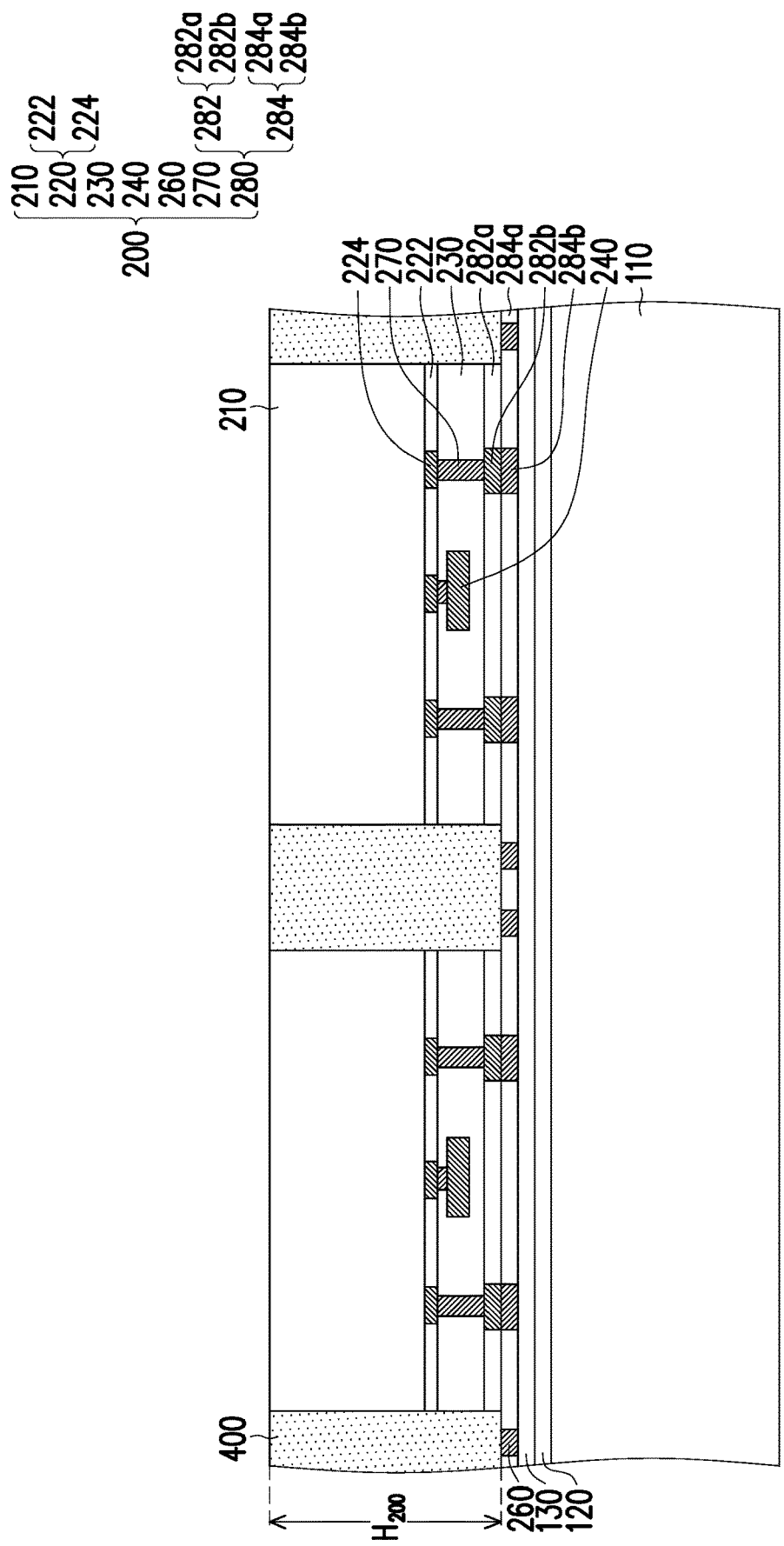

Referring to FIG. 4B, an insulating layer 400 is formed over the bonding layer 284 to laterally encapsulate the dies 200. The insulating layer 400 in FIG. 4B is similar to the insulating layer 400' in FIG. 2B, so the detailed description thereof is omitted herein. During the formation of the insulating layer 400, the semiconductor substrate 210' is thinned or planarized to form the semiconductor substrate 210. The step illustrated in FIG. 4B is similar to the step illustrated in FIG. 2B, so the detailed description thereof is omitted herein. As illustrated in FIG. 4B, the alignment marks 260 are directly in contact with the insulating layer 400. In some embodiments, the insulating layer 400 surrounds the semiconductor substrate 210, the interconnection structure 220, the passivation layer 230, and the bonding layer 282 (the first sub-layer of the bonding layer 280).

Figure 4C:
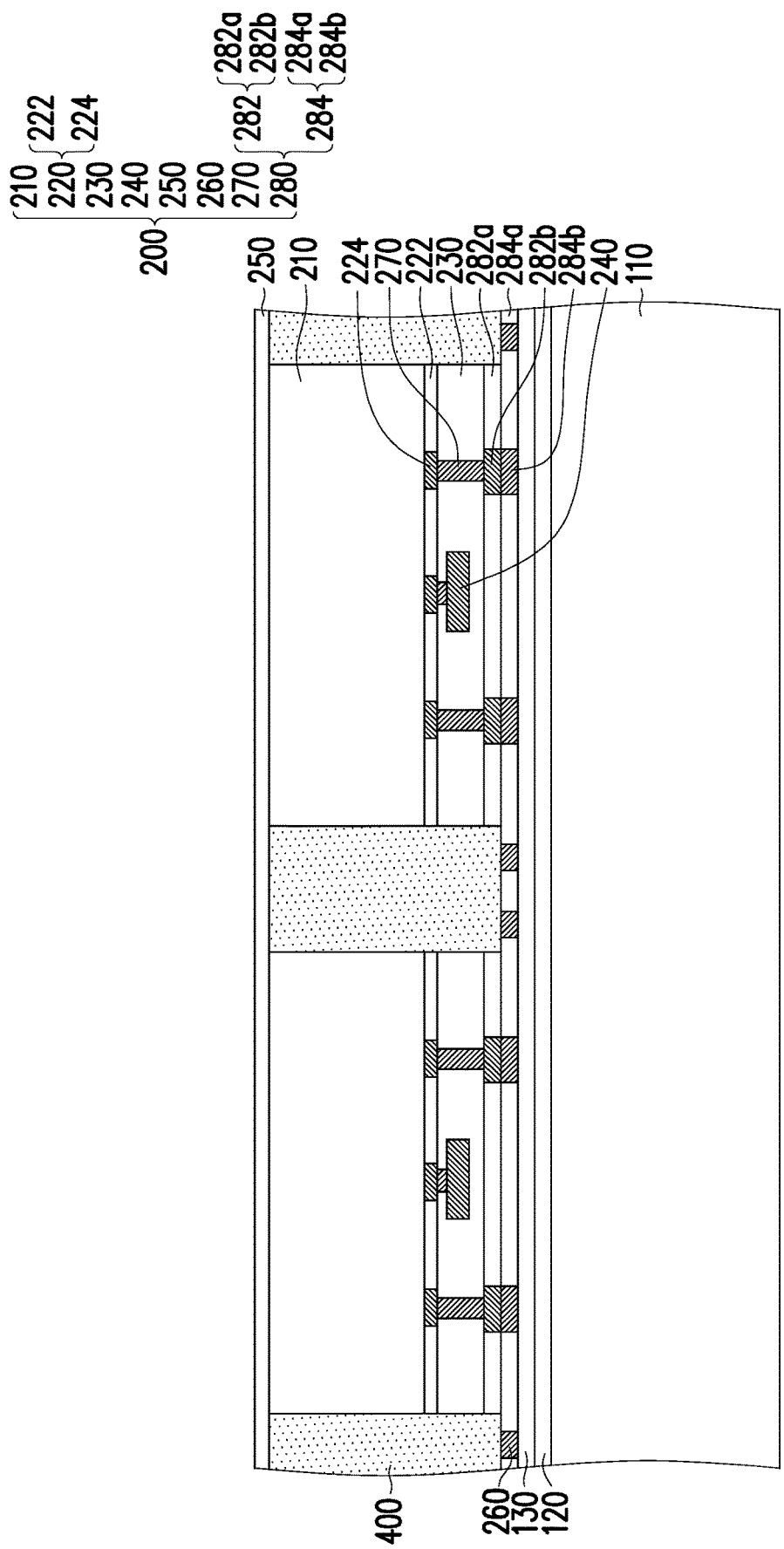

Referring to FIG. 4C, a bonding layer 250 is formed on the dies 200 and the insulating layer 400 opposite to the carrier substrate 110. In some embodiments, the bonding layer 250 is a smooth layer having a continuous even surface. In some embodiments, a material of the bonding layer 250 may include silicon oxynitride (SiON), silicon oxide, silicon nitride or the like, and the bonding layer 250 may be formed by deposition or the like. In some embodiments, the bonding layer 250 may be considered as part of the dies 200.

Figure 4D:
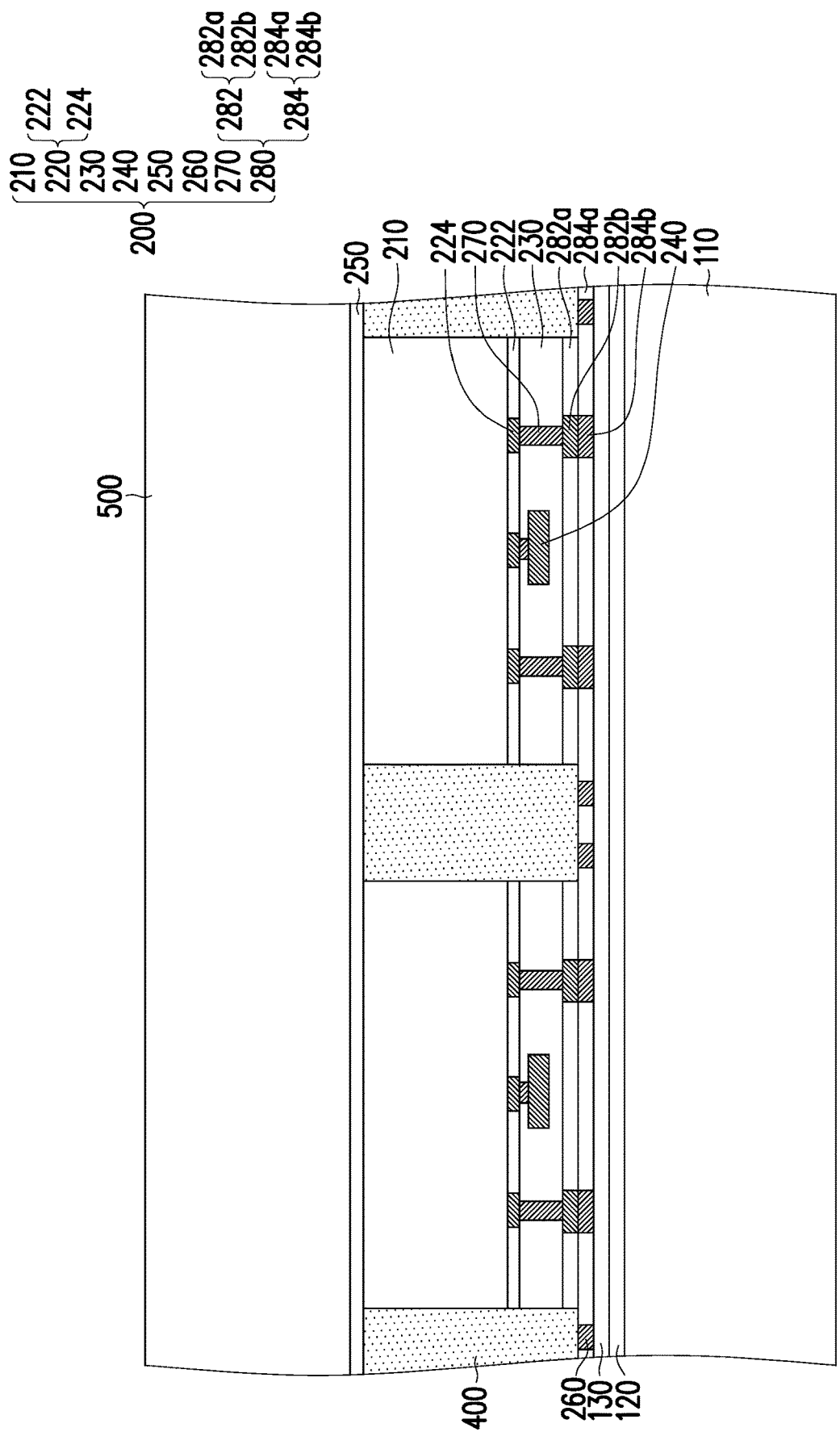

Referring to FIG. 4D, the bonding layer 250 is attached to a carrier substrate 500 opposite to the carrier substrate 110. That is, the dies 200 are bonded to the carrier substrate 500, and the carrier substrates 110, 500 are located on two opposite sides of the dies 200. In some embodiments, the carrier substrate 500 in FIG. 4D is similar to the carrier substrate 500 in FIG. 2D, so the detailed description thereof is omitted herein. In some embodiments, the carrier substrate 500 is adhered to the bonding layer 250 through fusion bonding. The fusion bonding process in FIG. 4C may be similar to the fusion bonding process shown in FIG. 2D, so the detailed description thereof is omitted herein. It should be noted that since the dies 200 are arranged on the carrier substrate 110 in a wafer form and the carrier substrate 500 is in wafer form as well, the bonding between the dies 200 and the carrier substrate 500 may be considered as a wafer-level process. That is, the bonding between the dies 200 and the carrier substrate 500 is a wafer-to-wafer bonding process. In some embodiments, with the presence of the alignment marks 260, the wafer-to-wafer bonding precision may be effectively improved.

Figure 4E:
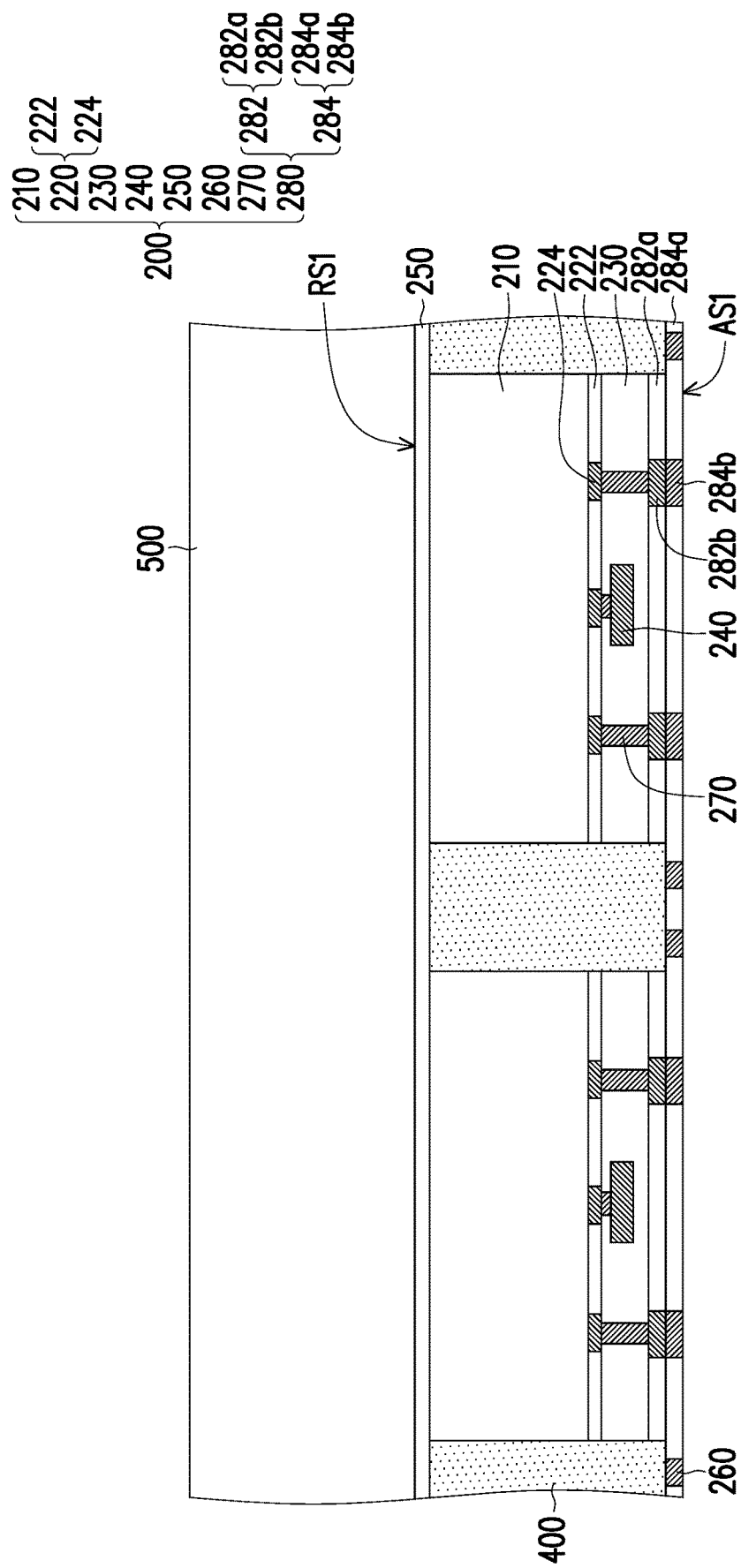

Referring to FIG. 4D and FIG. 4E, the carrier substrate 110, the dielectric layer 120, and the dielectric layer 130 are removed from the bonding layer 284. In some embodiments, the carrier substrate 110, the dielectric layer 120, and the dielectric layer 130 are removed through a planarization process, an etching process, a stripping process, the like, or a combination thereof. In some embodiments, bottom surfaces of the bonding pads 284b and a bottom surface of the dielectric layer 284a may be collectively referred to as active surfaces AS1 of the dies 200. On the other hand, the surface of the bonding layer 250 facing the carrier substrate 500 may be referred to as rear surfaces RS1 of the dies 200. As shown in FIG. 4E, the bottom surfaces of the bonding pads 284b and the bottom surface of the dielectric layer 284a are substantially located at the same level height to provide an appropriate active surfaces AS1 for hybrid bonding.

Figure 4F:
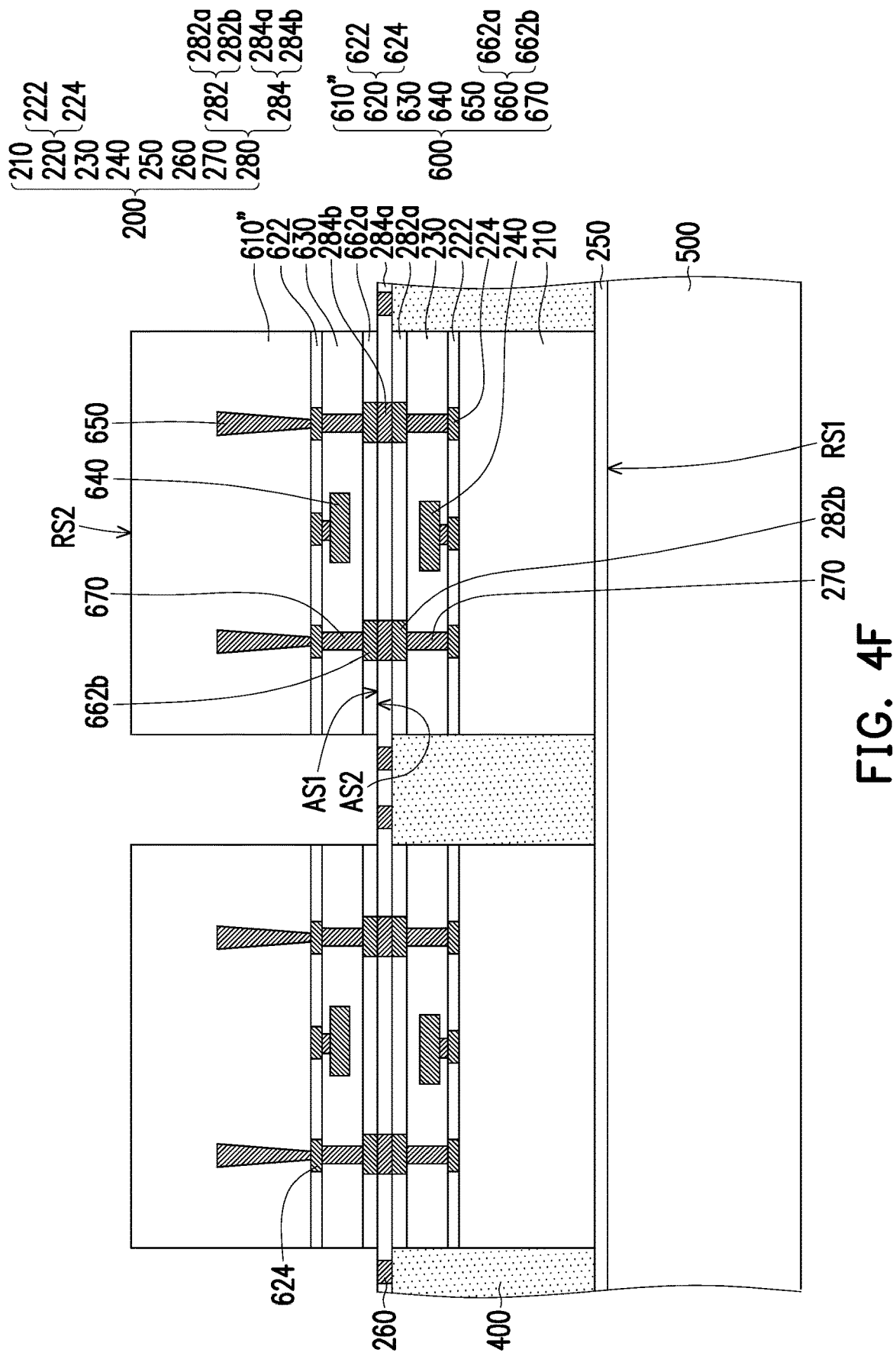

Referring to FIG. 4F, a plurality of dies 600 are provided. The dies 600 in FIG. 4F are similar to the dies 600 in FIG. 2H, so the detailed descriptions thereof are omitted herein. In some embodiments, the dies 600 are individually placed on the corresponding dies 200 such that each die 600 is bonded to the corresponding die 200. In some embodiments, each die 600 may be bonded to the corresponding die 200 through a hybrid bonding process. The step illustrated in FIG. 4F is similar to the step illustrated in FIG. 2H, so the detailed description thereof is omitted herein. In some embodiments, the bonding layer 284 (the second sub-layer of the bonding layer 280) is hybrid bonded to the bonding layer 660. That is, the dielectric layer 284a of the bonding layer 284 of the die 200 is hybrid bonded to the dielectric layer 662a of the bonding layer 660 of the die 600. Meanwhile, the bonding pads 284b of the bonding layer 284 are hybrid bonded to and are aligned with the bonding pads 662b of the bonding layer 660.

In some embodiments, since the active surfaces AS1 of the dies 200 are hybrid bonded to the active surfaces AS2 of the dies 600, the bonding between the dies 200 and the dies 600 may be considered as face-to-face bonding. In some embodiments, with the presence of the alignment marks 260, the bonding precision may be effectively improved. That is, with the aid of the alignment marks 260, the alignment between the bonding pads 284b and the corresponding bonding pads 662b may be ensured. It should be noted that although FIG. 4F illustrated that the sizes (i.e. the widths) of the dies 200 and the dies 600 are substantially identical, the disclosure is not limited thereto. In some alternative embodiments, the size of the dies 200 may differ from the size of the dies 600. For example, the size of the dies 200 may be larger than the size of the dies 600. Alternatively, the size of the dies 200 may be smaller than the size of the dies 600. Moreover, although FIG. 4F illustrated that the dies 200 and the dies 600 are bonded in a one-to-one manner, the disclosure is not limited thereto. Depending on the size of the die 200, multiple dies 600 may be bonded to one die 200.

Figure 4G:
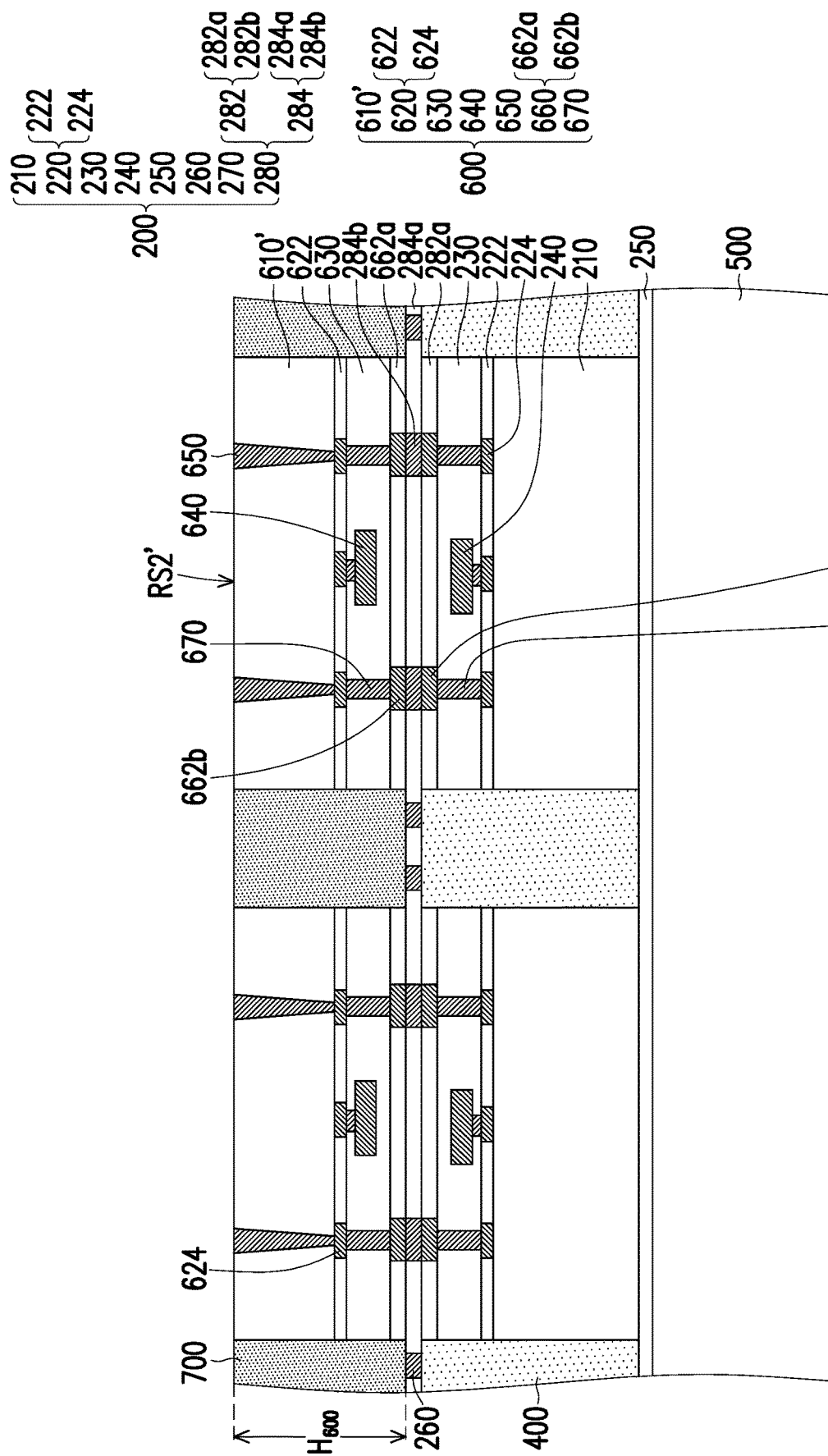
Figure 4H:
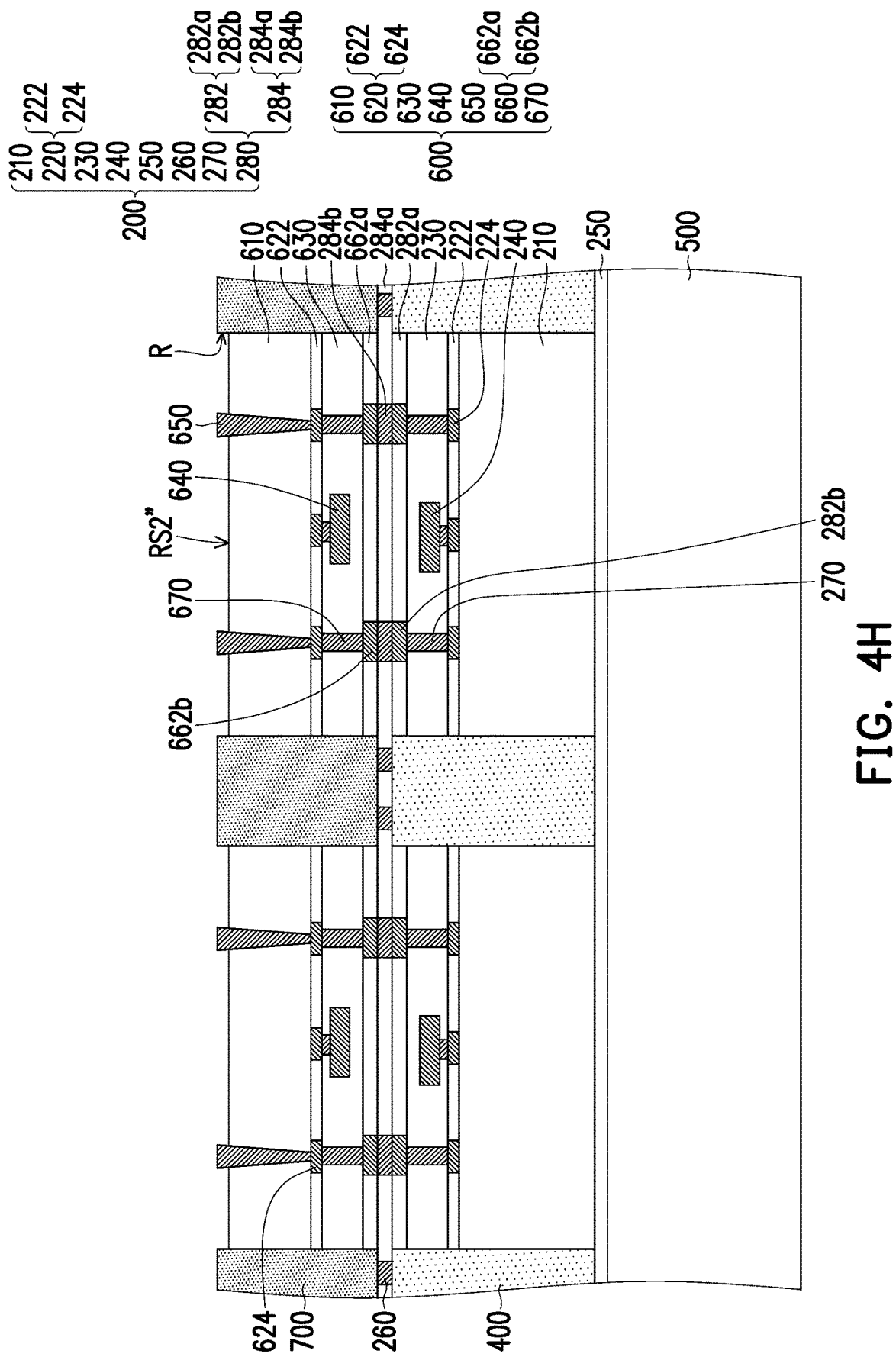
Figure 4I:
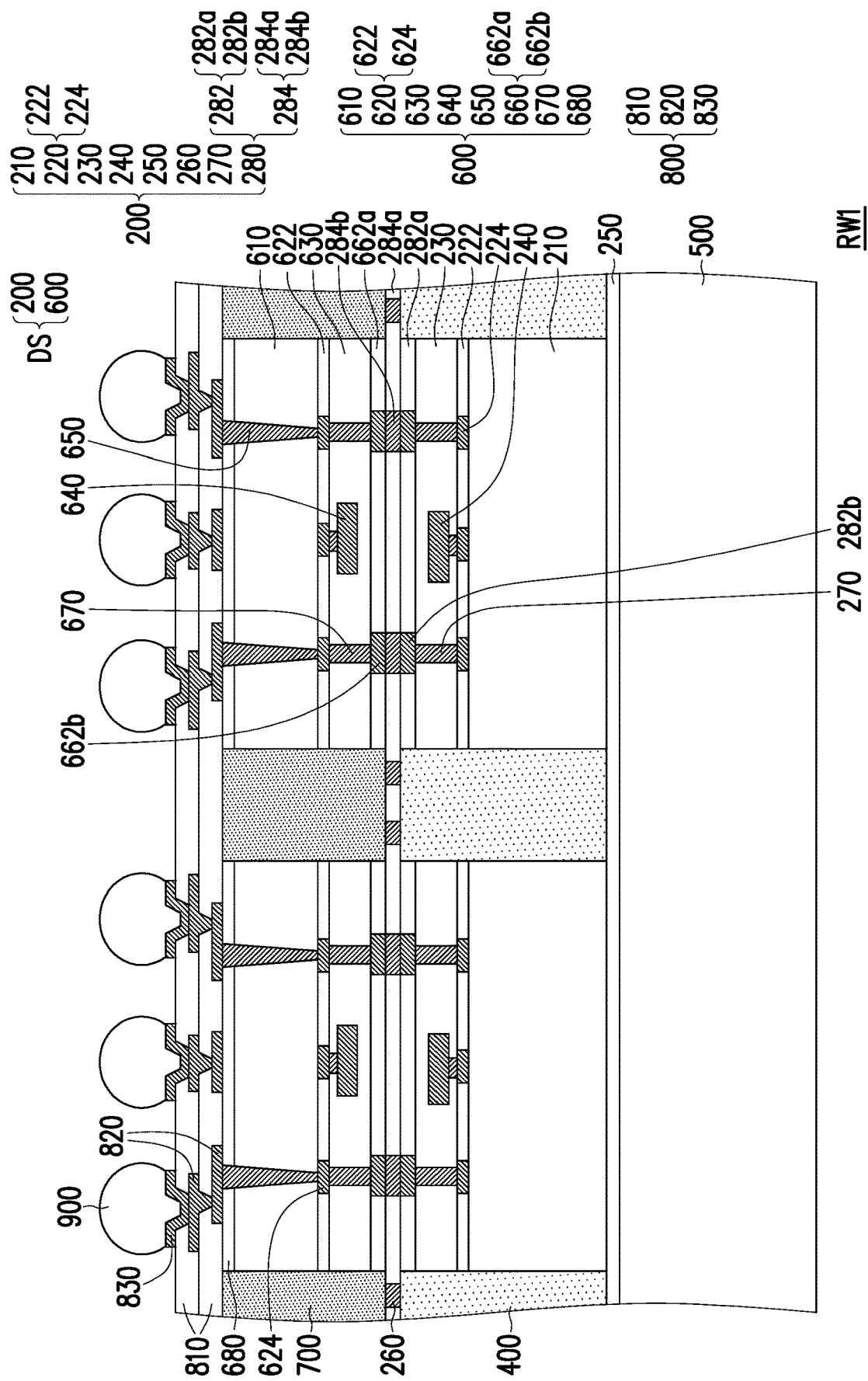

Referring to FIG. 4G to FIG. 4I, by further processing the structure illustrated in FIG. 4F, the reconstructed wafer RW1 is obtained. The steps illustrated in FIG. 4G to FIG. 4I are similar to the steps illustrated in FIG. 2I to FIG. 2K, so the detailed descriptions thereof are omitted herein. In some embodiments, since known good dies are assembled to the reconstructed wafer RW1, the yield of the reconstructed wafer RW1 may be sufficiently increased at a lower cost. Moreover, by providing die stacks DS in the reconstructed wafer RW1, the flexibility in chip size, chip thickness, and chip function integration may be effectively increased. Furthermore, by forming the reconstructed wafer RW1 with the foregoing process, the pitch of the redistribution conductive patterns in the redistribution structure 800 may be reduced to less than 0.8 μm, thereby achieving fine pitch configuration with larger I/O (input/output) connection.

Figure 5:
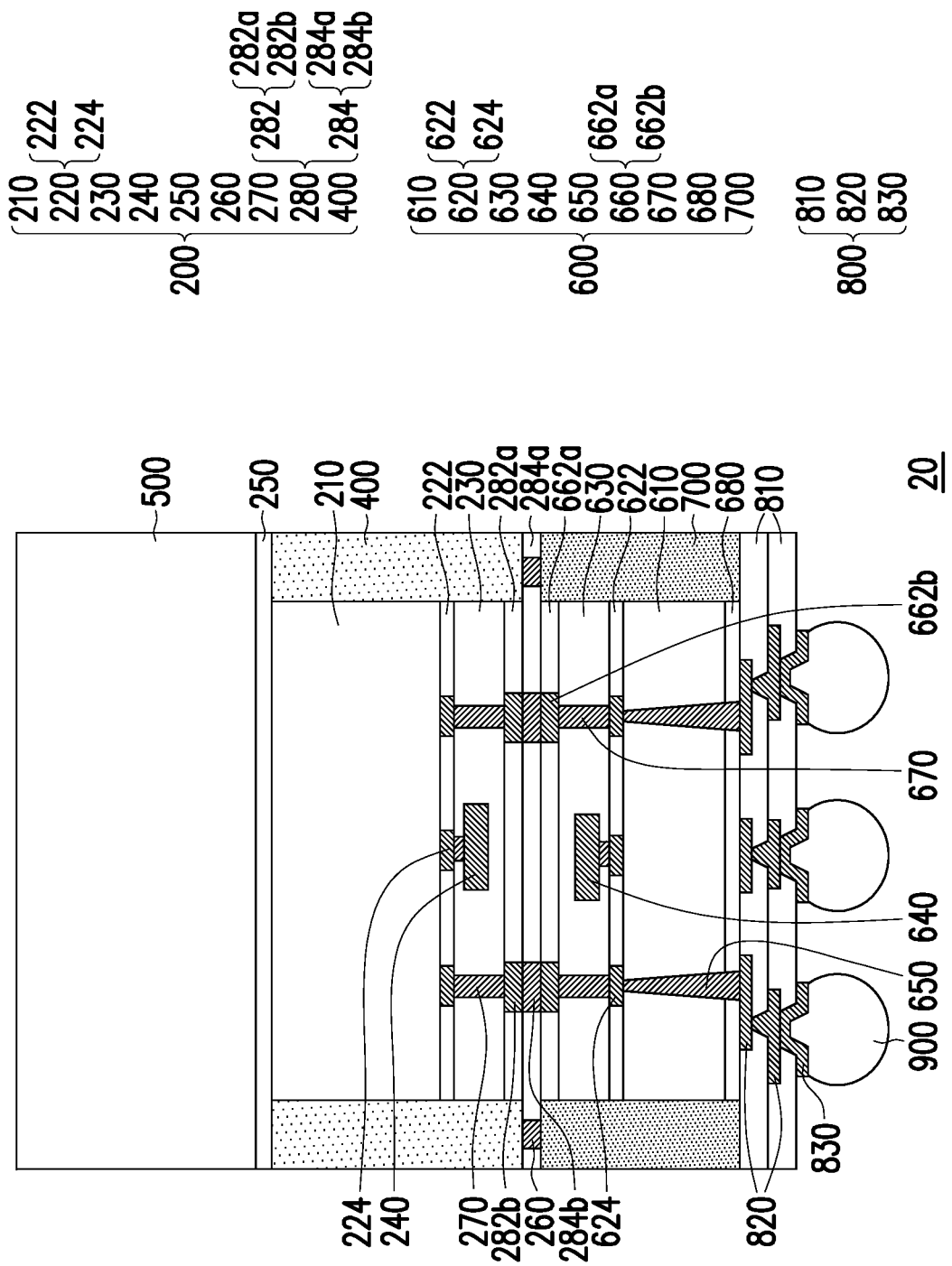
FIG. 5 is a schematic cross-sectional view illustrating a package in accordance with some alternative embodiments of the disclosure.

As mentioned above, the reconstructed wafer RW1 may undergo further processing to obtain a plurality of packages. FIG. 5 is a schematic cross-sectional view illustrating a package 20 in accordance with some alternative embodiments of the disclosure. Referring to FIG. 5, a singulation process is performed on the reconstructed wafer RW1 illustrated in FIG. 4I to form a plurality of packages 20. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the dielectric layers 810, the insulating layer 700, the dielectric layer 284a, the insulating layer 400, the bonding layer 250, and the carrier substrate 500 are being cut through. In some embodiments, after the singulation process, the insulating layer 400 may be considered as part of the die 200 while the insulating layer 700 may be considered as part of the die 600.

As illustrated in FIG. 5, the die 200 is stacked on the die 600. In other words, multiple dies 200, 600 are integrated into a single package 20. As such, the package 20 may be referred to as a "system on integrated circuit (SOIC) package." In some embodiments, the package 20 may be utilized in other modules/applications, such as chip on wafer on substrate (CoWoS) packaging, flip-chip packaging, integrated fan-out (InFO) packaging, fan-out wafer level packaging (WLP), or the like.

Figure 6:
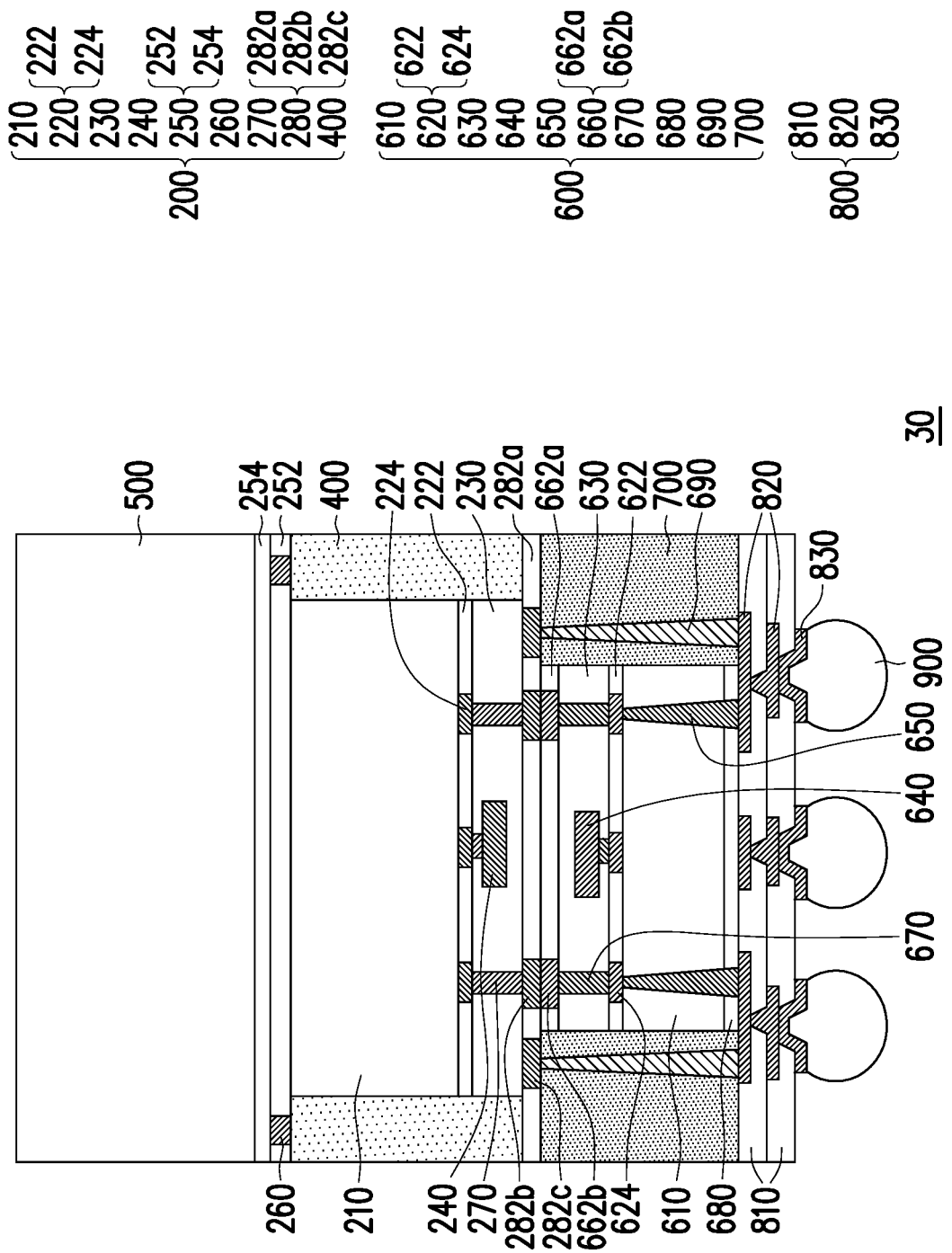
FIG. 6 is a schematic cross-sectional view illustrating a package in accordance with some alternative embodiments of the disclosure.

FIG. 6 is a schematic cross-sectional view illustrating a package 30 in accordance with some alternative embodiments of the disclosure. Referring to FIG. 6, the package 30 in FIG. 6 is similar to the package 10 in FIG. 3, so similar elements are denoted by the same reference numeral and the detailed descriptions thereof are omitted herein. As illustrated in FIG. 6, the bonding layer 280 of the die 200 further includes a plurality of conductive patterns 282c embedded in the dielectric layer 282a. Moreover, the die 600 further includes a plurality of through insulating vias (TSV) 690 penetrating through the insulating layer 700. In some embodiments, a material of the TSVs 690 includes, aluminum, titanium, copper, nickel, tungsten, and/or alloys thereof. The TSVs 690 may be formed through a plating process. In some embodiments, the TSVs 690 electrically connect the conductive patterns 282c of the bonding layer 280 of the die 200 and the redistribution conductive layer 820 of the redistribution structure 800. In other words, the die 200 may be electrically connected to the redistribution structure 800 through the TSVs 690.

Figure 7:
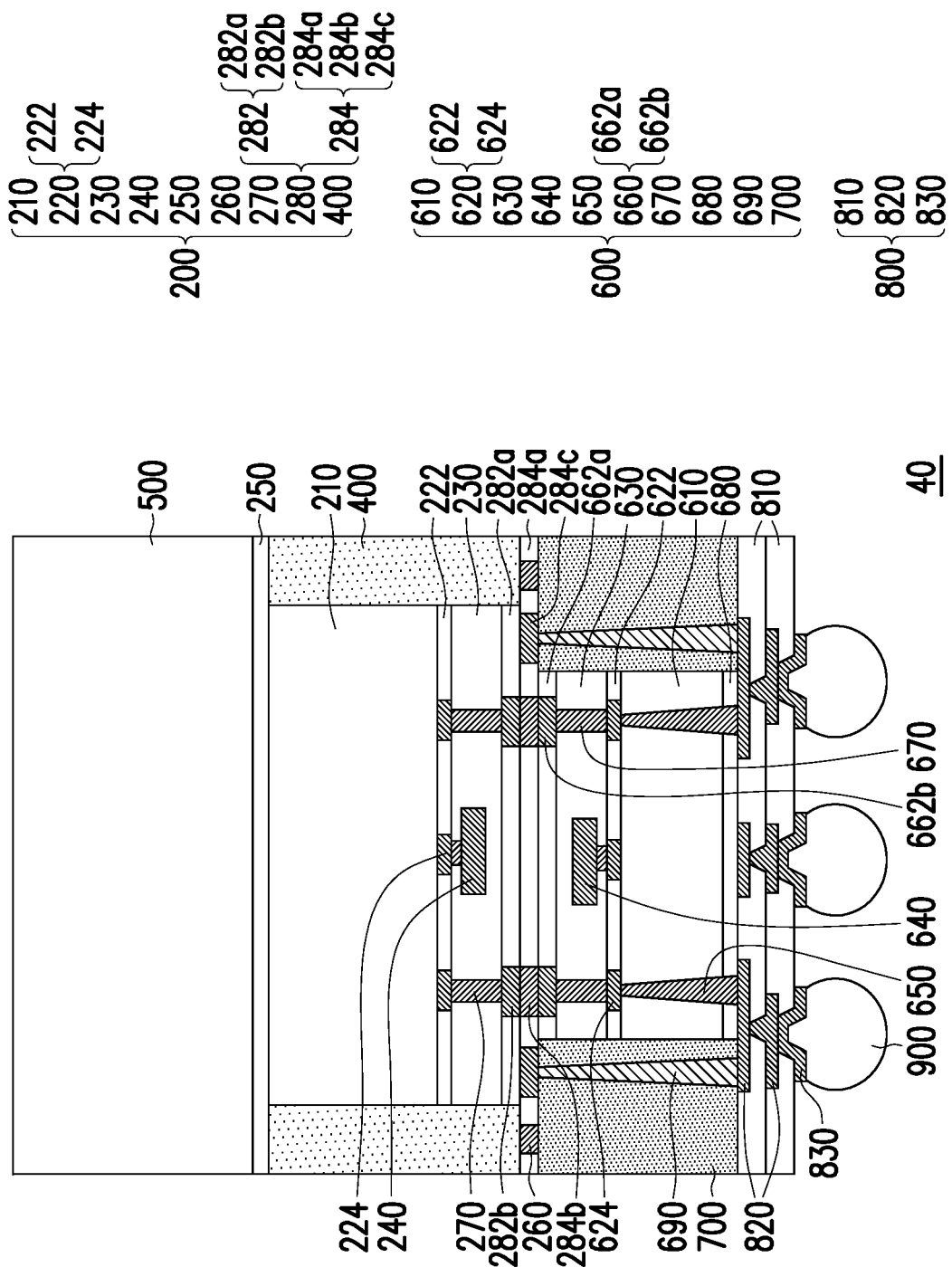
FIG. 7 is a schematic cross-sectional view illustrating a package in accordance with some alternative embodiments of the disclosure.

FIG. 7 is a schematic cross-sectional view illustrating a package 40 in accordance with some alternative embodiments of the disclosure. Referring to FIG. 7, the package 40 in FIG. 7 is similar to the package 20 in FIG. 5, so similar elements are denoted by the same reference numeral and the detailed descriptions thereof are omitted herein. As illustrated in FIG. 7, the bonding layer 284 (the second sub-layer of the bonding layer 280) of the die 200 further includes a plurality of conductive patterns 284c embedded in the dielectric layer 284a. Moreover, the die 600 further includes a plurality of through insulating vias (TSV) 690 penetrating through the insulating layer 700. In some embodiments, a material of the TSVs 690 includes, aluminum, titanium, copper, nickel, tungsten, and/or alloys thereof. The TSVs 690 may be formed through a plating process. In some embodiments, the TSVs 690 electrically connect the conductive patterns 284c of the bonding layer 284 of the die 200 and the redistribution conductive layer 820 of the redistribution structure 800. In other words, the die 200 may be electrically connected to the redistribution structure 800 through the TSVs 690.

In accordance with some embodiments of the disclosure, a package includes a carrier substrate, a first die, and a second die. The first die includes a first bonding layer, a second bonding layer opposite to the first bonding layer, and an alignment mark embedded in the first bonding layer. The first bonding layer is fusion boded to the carrier substrate. The second die includes a third bonding layer. The third bonding layer is hybrid bonded to the second bonding layer of the first die.

In accordance with some embodiments of the disclosure, a package includes a carrier substrate, a first die, and a second die. The first die includes a first bonding layer and a second bonding layer opposite to the first bonding layer. The first bonding layer is fusion bonded to the carrier substrate. The second bonding layer includes a first sub-layer and a second sub-layer. The first sub-layer is hybrid bonded to the second sub-layer. The second die includes a third bonding layer. The third bonding layer is hybrid bonded to the second sub-layer of the second bonding layer of the first die.

In accordance with some embodiments of the disclosure, a manufacturing method of a reconstructed wafer includes at least the following steps. A first carrier substrate having a first alignment mark formed thereon is provided. A plurality of first dies is attached to the first carrier substrate. The first dies are arranged in an array. The first dies are fusion bonded to the second carrier substrate opposite to the first carrier substrate. The first carrier substrate is removed from the first dies. A first bonding layer is formed onto the first dies. A plurality of second dies are individually placed on the corresponding first dies. Each second die includes a semiconductor substrate, a plurality of through semiconductor vias (TSV) embedded in the semiconductor substrate, and a second bonding layer over the semiconductor substrate. The second bonding layers of the second dies are hybrid bonded to the first bonding layer. The second dies are planarized until the TSVs are exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a carrier substrate;
a first die comprising a first bonding layer, a second bonding layer opposite to the first bonding layer, and an alignment mark embedded in the first bonding layer, wherein the first bonding layer is fusion bonded to the carrier substrate; and
a second die comprising a third bonding layer, wherein the third bonding layer is hybrid bonded to the second bonding layer of the first die, and the first die is located between the carrier substrate and the second die.

2. The package of claim 1, wherein the carrier substrate comprises semiconductor materials.

3. The package of claim 1, wherein the second bonding layer and the third bonding layer respectively comprises a dielectric layer and a plurality of bonding pads embedded in the dielectric layer, the dielectric layer of the second bonding layer is hybrid bonded to the dielectric layer of the third bonding layer, and the bonding pads of the second bonding layer are hybrid bonded to and are aligned with the corresponding bonding pads of the third bonding layer.

4. The package of claim 3, wherein the first die further comprises:
 a semiconductor substrate;
 an interconnection structure over the semiconductor substrate;
 a passivation layer over the interconnection structure;
 a plurality of bonding vias penetrating through the passivation layer and electrically connecting the interconnection structure and the bonding pads of the second bonding layer; and
 an insulating layer surrounding the semiconductor substrate, the interconnection structure, and the passivation layer, wherein the second bonding layer is stacked on the passivation layer, the bonding vias, and the insulating layer.

5. The package of claim 4, wherein the alignment mark is located directly on the insulating layer.

6. The package of claim 4, wherein the first bonding layer comprises a first sub-layer and a second sub-layer, the first sub-layer is attached to the insulating layer and the semiconductor substrate, the second sub-layer is attached to the carrier substrate, and the alignment mark is embedded in the first sub-layer.

7. The package of claim 3, wherein the second die further comprises:
 a semiconductor substrate having a plurality of through semiconductor vias (TSV) embedded therein;
 an interconnection structure over the semiconductor substrate and electrically connected to the TSVs;
 a passivation layer over the interconnection structure;
 a plurality of bonding vias penetrating through the passivation layer and electrically connecting the interconnection structure and the bonding pads of the third bonding layer; and
 an insulating layer surrounding the semiconductor substrate, the interconnection structure, the passivation layer, and the third bonding layer.

8. The package of claim 7, wherein the second die further comprises a plurality of through insulating vias (TIVs) penetrating through the insulating layer.

9. A package, comprising:
 a carrier substrate;
 a first die comprising a first bonding layer and a second bonding layer opposite to the first bonding layer, wherein the first bonding layer is fusion bonded to the carrier substrate, the second bonding layer comprises a first sub-layer and a second sub-layer, the first sub-layer is hybrid bonded to the second sub-layer; and
 a second die comprising a third bonding layer, wherein the third bonding layer is hybrid bonded to the second sub-layer of the second bonding layer of the first die, and the first die is located between the carrier substrate and the second die.

10. The package of claim 9, wherein the carrier substrate comprises semiconductor materials.

11. The package of claim 9, wherein the first sub-layer, the second sub-layer, and the third bonding layer respectively comprises a dielectric layer and a plurality of bonding pads embedded in the dielectric layer, the dielectric layer of the first sub-layer is hybrid bonded to the dielectric layer of the second sub-layer, the bonding pads of the first sub-layer are hybrid bonded to and are aligned with the corresponding bonding pads of the second sub-layer, the dielectric layer of the second sub-layer is hybrid bonded to the dielectric layer of the third bonding layer, and the bonding pads of the second sub-layer are hybrid bonded to and are aligned with the corresponding bonding pads of the third bonding layer.

12. The package of claim 11 wherein the first die further comprises:
 a semiconductor substrate;
 an interconnection structure over the semiconductor substrate;
 a passivation layer over the interconnection structure;
 a plurality of bonding vias penetrating through the passivation layer and electrically connecting the interconnection structure and the bonding pads of the first sub-layer; and
 an insulating layer surrounding the semiconductor substrate, the interconnection structure, the passivation layer, and the first sub-layer.

13. The package of claim 12, wherein the first die further comprises an alignment mark embedded in the second sub-layer, and the alignment mark is directly in contact with the insulating layer.

14. The package of claim 11, wherein the second die further comprises:
 a semiconductor substrate having a plurality of through semiconductor vias (TSV) embedded therein;
 an interconnection structure over the semiconductor substrate;
 a passivation layer over the interconnection structure;
 a plurality of bonding vias penetrating through the passivation layer and electrically connecting the interconnection structure and the bonding pads of the third bonding layer; and
 an insulating layer surrounding the semiconductor substrate, the interconnection structure, the passivation layer, and the third bonding layer.

15. The package of claim 14, wherein the second die further comprises a plurality of through insulating vias (TIVs) penetrating through the insulating layer.

16. A package, comprising:
 a carrier substrate;
 a first die disposed on the carrier substrate, comprising:
  a semiconductor substrate;
  a first bonding layer sandwiched between the semiconductor substrate and the carrier substrate, wherein the first bonding layer extends beyond a span of the semiconductor substrate; and
  a second bonding layer disposed over the semiconductor substrate opposite to the first bonding layer, wherein the second bonding layer comprises a first sub-layer and a second sub-layer bonded to the first sub-layer, and the second sub-layer extends beyond a span of the semiconductor substrate; and
 a second die comprising a third bonding layer, wherein the third bonding layer is bonded to the second sub-layer of the second bonding layer of the first die, and the first die is located between the carrier substrate and the second die.

17. The package of claim 16, wherein sidewalls of the first sub-layer are aligned with sidewalls of the semiconductor substrate.

18. The package of claim 16, wherein the first die further comprises an insulating layer laterally surrounding the semiconductor substrate, and the insulating layer is sandwiched between the second sub-layer and the first bonding layer.

19. The package of claim 18, wherein the first die further comprises an alignment mark embedded in the second sub-layer, and the alignment mark is directly in contact with the insulating layer.

20. The package of claim 16, wherein the carrier substrate comprises semiconductor materials.

* * * * *